(12) United States Patent
Golovchenko et al.

(10) Patent No.: US 7,253,434 B2
(45) Date of Patent: Aug. 7, 2007

(54) SUSPENDED CARBON NANOTUBE FIELD EFFECT TRANSISTOR

(75) Inventors: Jene A. Golovchenko, Lexington, MA (US); Haibing Peng, Albany, CA (US)

(73) Assignee: President and Fellows of Harvard College, Cambridge, MA (US)

( * ) Notice: Subject to any disclaimer, the term of this patent is extended or adjusted under 35 U.S.C. 154(b) by 103 days.

(21) Appl. No.: 11/145,650

(22) Filed: Jun. 6, 2005

(65) Prior Publication Data

US 2006/0006377 A1    Jan. 12, 2006

Related U.S. Application Data

(63) Continuation-in-part of application No. 10/696,462, filed on Oct. 29, 2003.

(60) Provisional application No. 60/422,041, filed on Oct. 29, 2002, provisional application No. 60/577,810, filed on Jun. 8, 2004.

(51) Int. Cl.
*H01L 29/08* (2006.01)
*H01L 35/24* (2006.01)
*H01L 51/00* (2006.01)

(52) U.S. Cl. ............... 257/40; 257/401; 257/E51.04

(58) Field of Classification Search ............ 257/40, 257/401, E51.04

See application file for complete search history.

(56) References Cited

U.S. PATENT DOCUMENTS

| | | |
|---|---|---|
| 6,297,063 B1 | 10/2001 | Brown et al. |
| 6,333,016 B1 | 12/2001 | Resasco et al. |
| 6,346,189 B1 | 2/2002 | Dai et al. |
| 6,350,488 B1 | 2/2002 | Lee et al. |
| 6,361,861 B2 | 3/2002 | Gao et al. |
| 6,515,339 B2 | 2/2003 | Shin et al. |

(Continued)

FOREIGN PATENT DOCUMENTS

DE    102 50 829 A1    10/2002

(Continued)

OTHER PUBLICATIONS

Kong et al., "Synthesis of individual single-walled carbon nanotubes on patterned silicon wafers," Nature, vol. 395, pp. 878-881, Oct. 29, 1998.

(Continued)

*Primary Examiner*—Ngân V. Ngô
(74) *Attorney, Agent, or Firm*—Theresa A. Lober

(57) ABSTRACT

The invention provides a carbon nanotube field effect transistor including a nanotube having a length suspended between source and drain electrodes. A gate dielectric material coaxially coats the suspended nanotube length and at least a portion of the source and drain electrodes. A gate metal layer coaxially coats the gate dielectric material along the suspended nanotube length and overlaps a portion of the source and drain electrodes, and is separated from those electrode portions by the gate dielectric material. The nanotube field effect transistor is fabricated by coating substantially the full suspended nanotube length and a portion of the source and drain electrodes with a gate dielectric material. Then the gate dielectric material along the suspended nanotube length and at least a portion of the gate dielectric material on the source and drain electrodes are coated with a gate metal layer.

34 Claims, 8 Drawing Sheets

U.S. PATENT DOCUMENTS

| | | | |
|---|---|---|---|
| 6,528,020 | B1 | 3/2003 | Dai et al. |
| 6,555,362 | B2 | 4/2003 | Hidaka et al. |
| 6,566,704 | B2 * | 5/2003 | Choi et al. .................. 257/314 |
| 6,566,983 | B2 | 5/2003 | Shin |
| 6,605,894 | B2 | 8/2003 | Choi et al. |
| 6,689,674 | B2 * | 2/2004 | Zhang et al. ............... 438/584 |
| 6,706,402 | B2 * | 3/2004 | Rueckes et al. ............ 428/408 |
| 6,706,566 | B2 | 3/2004 | Avouris et al. |
| 6,891,227 | B2 | 5/2005 | Appenzeller et al. |
| 6,919,592 | B2 * | 7/2005 | Segal et al. .................. 257/209 |
| 6,942,921 | B2 * | 9/2005 | Rueckes et al. ............ 428/408 |
| 7,120,047 | B2 * | 10/2006 | Segal et al. ................. 365/151 |
| 2001/0009693 | A1 | 7/2001 | Lee et al. |
| 2002/0014667 | A1 | 2/2002 | Shin et al. |
| 2002/0046872 | A1 | 4/2002 | Smalley et al. |
| 2002/0167374 | A1 | 11/2002 | Hunt et al. |
| 2002/0172767 | A1 | 11/2002 | Grigorian et al. |
| 2003/0157333 | A1 | 8/2003 | Ren et al. |
| 2003/0186167 | A1 | 10/2003 | Johnson, Jr. et al. |
| 2003/0214054 | A1 | 11/2003 | Awano et al. |
| 2004/0043527 | A1 | 3/2004 | Bradley et al. |
| 2004/0132070 | A1 | 7/2004 | Star et al. |
| 2004/0144972 | A1 | 7/2004 | Dai et al. |
| 2004/0200734 | A1 * | 10/2004 | Co et al. .................. 205/777.5 |
| 2005/0007002 | A1 | 1/2005 | Golovchenko et al. |
| 2005/0224778 | A1 * | 10/2005 | Dubin et al. .................... 257/3 |
| 2006/0006377 | A1 * | 1/2006 | Golovchenko et al. ....... 257/39 |
| 2006/0065887 | A1 * | 3/2006 | Tiano et al. .................. 257/20 |
| 2006/0158760 | A1 * | 7/2006 | Portico Ambrosio et al. .... 359/883 |
| 2007/0012980 | A1 * | 1/2007 | Duan et al. ................. 257/296 |

FOREIGN PATENT DOCUMENTS

| | | |
|---|---|---|
| WO | WO 01/44796 A1 | 6/2001 |
| WO | WO 02/26624 A1 | 4/2002 |
| WO | WO 02/054505 A2 | 7/2002 |
| WO | WO 02/092505 A2 | 11/2002 |
| WO | WO 2004/040616 A2 | 5/2004 |

OTHER PUBLICATIONS

Fan et al., "Self-Oriented Regular Arrays of Carbon Nanotubes and Their Field Emission Properties," Science, vol. 283, pp. 512-514, Jan. 22, 1999.

Martel et al., "Single- and multi-wall carbon nanotube field-effect transistors," Appl. Phys. Lett., vol. 73, No. 17, pp. 2447-2449, Oct. 26, 1998.

Ren et al., "Growth of a single freestanding multiwall carbon nanotube on each nanonickel dot," Appl. Phys. Letts., vol. 75, No. 8, pp. 1086-1088, Aug. 23, 1999.

Cassell et al., "Directed Growth of Free-Standing Single-Walled Carbon Nanotubes," J. Am. Chem. Soc., vol. 121, pp. 7975-7976, 1999.

Seeger et al., "SiOx-coating of carbon nanotubes at room temperature," Chem. Phys. Lett., vol. 339, pp. 41-46, May 4, 2001.

Zhang et al., "Electric-field-directed growth of aligned single-walled carbon nanotubes," Appl. Phys. Lett., vol. 79, No. 19, pp. 3155-3157, Nov. 5, 2001.

Wind et al., "Vertical scaling of carbon nanotube field-effect transistors using top gate electrodes," Appl. Phys. Lett., vol. 80, No. 20, pp. 3817-3819, May 20, 2002.

Franklin et al., "Integration of suspended carbon nanotube arrarys into electronic devices and electromechanical systems," Appl. Phys. Lett., vol. 81, No. 5, pp. 913-915, Jul. 29, 2002.

Homma et al., "Growth of suspended carbon nanotube networks on 100-nm-scale silicon pillars," Appl. Phys. Lett., vol. 81, No. 12, pp. 2261-2263, Sep. 16, 2002.

Ural et al., "Electric-field-aligned growth of single-walled carbon nanotubes," Appl. Phys. Lett., vol. 81, No. 18, pp. 3464-3466, Oct. 28, 2002.

Campbell et al., "Simple catalyst for the growth of small-diameter carbon nanotubes," Appl. Phys. Lett., vol. 81, No. 24, pp. 4586-4588, Dec. 9, 2002.

Javey et al., "High-k dielectrics for advanced carbon-nanotube transistors and logic gates," Nature Materials, vol. 1, pp. 241-246, Dec. 2002.

Whitsitt et al., "Silica Coated Single Walled Carbon Nanotubes," Nano Letters, vol. 3, No. 6, pp. 775-778, 2003.

Zambov et al., "Template-Directed CVD of Dielectric Nanotubes," Chem. Vap. Deposition, vol. 9, No. 1, pp. 26-33, 2003.

Marty et al., "Self-assembled single wall carbon nanotube field effect transistors," IEEE Nano, vol. 2, pp. 240-243, 2003.

Han et al., "Coating Single-Walled Carbon Nanotubes with Tin Oxide," Nano Letters, vol. 3, No. 5, pp. 681-683, 2003.

Chung et al., "Nanoscale gap fabrication and integration of carbon nanotubes by micromachining," Sensors and Actuators A, vol. 104, pp. 229-235, 2003.

Peng et al., "Patterned growth of single-walled carbon nanotube arrays from a vapor-deposited Fe catalyst," Appl. Phys. Lett., vol. 83, No. 20, pp. 4238-4240, Nov. 17, 2003.

Chin et al., "Optical limiting properties of amorphous SixNy and SiC coated carbon nanotubes," Chem. Phys. Lett., vol. 383, pp. 72-75, 2004.

Radosavljevic et al., "High performance of potassium n-doped carbon nanotube field-effect transistors," Appl. Phys. Lett., vol. 84, No. 18, pp. 3693-3695, May 3, 2004.

Graham et al., "Towards the integration of carbon nanotubes in microelectronics," Diamond and Related Materials, vol. 13, pp. 1296-1300, 2004.

Peng et al., "Coulomb blockade in suspended Si3N4-coated single-walled carbon nanotubes," Appl. Phys. Lett., vol. 84, No. 26, pp. 5428-5430, Jun. 28, 2004.

* cited by examiner

SUSPENDED CARBON NANOTUBE FIELD EFFECT TRANSISTOR

This application claims the benefit of U.S. Provisional Application No. 60/577,810, filed Jun. 8, 2004, the entirety of which is hereby incorporated by reference. This application is a continuation-in-part of U.S. application Ser. No. 10/696, 462, filed Oct. 29, 2003, which in turn claim the benefit of U.S. Provisional Application No. 60/422,041, filed Oct. 29, 2002, the entirety of which is hereby incorporated by reference.

STATEMENT REGARDING FEDERALLY SPONSORED RESEARCH

This invention was made with Government support under Contract No. F49620-01-1-0467, awarded by DARPA, and under Contract No. DMR-0073590, awarded by the NSF. The Government has certain rights in the invention.

BACKGROUND OF INVENTION

This invention relates generally to carbon nanotube field effect transistors, and more particularly relates to techniques for controllably fabricating and carbon nanotube field effect transistors.

Since their discovery, carbon nanotubes have attracted intense research into their electrical and mechanical properties and have been proposed for implementation in a wide range of electronics as well as mechanical and electromechanical applications. In particular it has been demonstrated that carbon nanotubes are distinctly well-suited for applications including, e.g., microelectronic and nanoelectronic devices and systems, chemical sensors, transducers, displays, physical probes, and energy storage devices.

There is currently fast-growing interest in the fabrication of field effect transistors (FETs) with carbon nanotubes employed as the channels of the transistors. With the experimental demonstration of a nanotube field effect transistor now achieved, the application of nanotube transistors to nanoelectronic technologies is becoming increasingly popular. Nanocomputing, nanosensing, and other nano-scale applications can be well-addressed by nanotube-based devices. To fully realize such nanotube-based devices, reliable production of high-performance semiconducting nanotube FETs is required.

SUMMARY OF THE INVENTION

The invention provides a carbon nanotube field effect transistor and a method for fabricating the transistor. The transistor includes a carbon nanotube having a length that is suspended between a source electrode and a drain electrode. The carbon nanotube can be provided as a p-type nanotube or rendered n-type by a doping layer, and a barrier layer if needed. A gate dielectric material coaxially coats the suspended nanotube length and further coats at least a portion of the source and drain electrodes. A gate metal layer coaxially coats the gate dielectric material along the suspended nanotube length. The gate metal layer also overlaps a portion of the source and the drain electrodes and is separated from those electrode portions by the gate dielectric material. The nanotube field effect transistor of the invention is fabricated by first synthesizing a carbon nanotube having a length suspended between a source electrode and a drain electrode. Then substantially the entire suspended nanotube length is coated with a gate dielectric material. At least a portion of the source and drain electrodes are also coated with a gate dielectric material. Then the gate dielectric material along the suspended nanotube length and at least a portion of the gate dielectric material on the source and drain electrodes are coated with a gate metal layer.

Nanotube field effect transistors in the configuration provided by the invention, with p-type or n-type semiconducting nanotubes incorporating selected dielectrics, dopant coatings, and electrically conducting coatings enable stable and reproducible FET device operation in a variety of environments and with high transconductance. Other features and advantages of the invention will be apparent from the following description and accompanying drawings, and from the claims.

DETAILED DESCRIPTION OF THE INVENTION

Figure 1A:
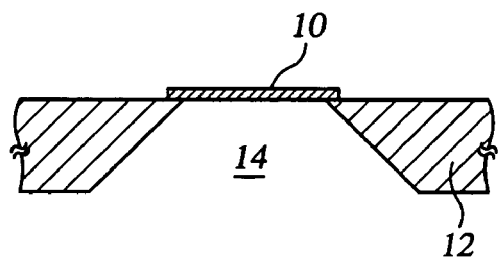
FIGS. 1A-1B are schematic cross-sectional and planar views, respectively, of a carbon nanotube provided in accordance with the invention suspended over an aperture in a substrate.
Figure 1B:
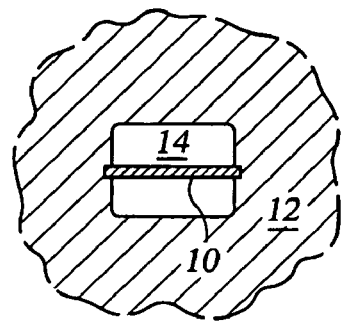

The invention provides nanotube device configurations and corresponding growth process sequences that enable repeatable and reliable production of nanotubes, and single-wall nanotubes in particular, in the selected configurations. Referring to FIG. 1A, in a first nanotube device in accordance with the invention, there is provided a nanotube 10 the ends of which contact a support structure such as a substrate 12 having an aperture 14 across which the single-walled nanotube extends. As shown in the planar top-down view of FIG. 1B, because the aperture 14 extends completely through the substrate 12 the nanotube forms a bridge across the aperture and can be accessed from either face of the substrate. Although the substrate aperture 14 is shown in this example as being square, such is not specifically required; the aperture can be provided as any convenient shape, e.g., circular, rectangular, or other suitable shape.

Figure 2A:
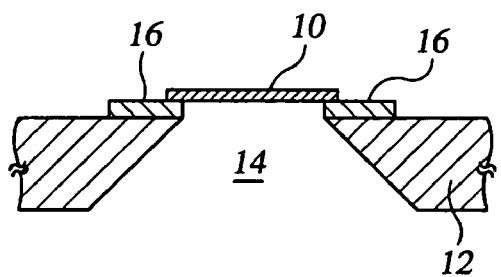
FIGS. 2A-2B are schematic cross-sectional and planar views, respectively, of a carbon nanotube provided in accordance with the invention suspended over an aperture in a substrate and connecting two electrically conducting contact pads.
Figure 2B:
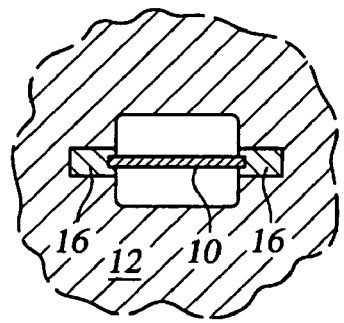

Referring now to FIGS. 2A-2B, this suspended nanotube configuration can be employed in accordance with the invention to make electrical contact between two electrodes or electrically conducting regions on the substrate. For example, as shown in FIG. 2A, there can be provided electrical contact pads 16 atop a substrate 12 having an aperture 14 across which a nanotube extends. As shown in FIG. 2B, the nanotube 10 makes a bridging contact between the two electrodes across the aperture in the substrate 12. The nanotube is synthesized, by the process described below, to be located on top of the contact pads. Although in this example configuration there are shown contact pads 16 at opposite ends of the aperture 12 such is not specifically required; contact pads can be provided at other locations around the periphery of the aperture and can be provided as groups of three or more electrodes as suitable for a given application.

As these examples illustrate, the invention provides the ability to produce selected arrangements of nanotubes on a substrate in various nanotube device configurations. A common feature of all arrangements provided by the invention is an aperture or other configuration in a support substrate which enables access to the nanotube from both sides of the substrate. The nanotube thereby forms a bridge across the substrate aperture. With this arrangement, the nanotube can be employed in a wide range of applications for which there is required exposure of the nanotube to an environment of interest. For example, a gas or liquid of interest can be directed through the substrate aperture to enable sensing or other function by the nanotube as the gas or liquid passes around the nanotube. Also, these configurations can be used directly in nano-electromechanical applications, such as high frequency resonators.

In addition, the suspended nanotube arrangement provided by the invention enables in situ examination and test of a synthesized nanotube in a particularly convenient manner. It is now common practice to examine synthesized nanotubes by transmission electron microscopy (TEM) to determine the nanotube diameter, wall thickness, and single- or multi-wall configuration of the nanotube. In general, TEM requires the ability to configure a nanotube under investigation between an electron beam source and a detector. With the arrangement of the invention, a synthesized nanotube as-grown on a substrate can be examined in situ, without the need for destructive nanotube removal or physical interference.

Figure 3:
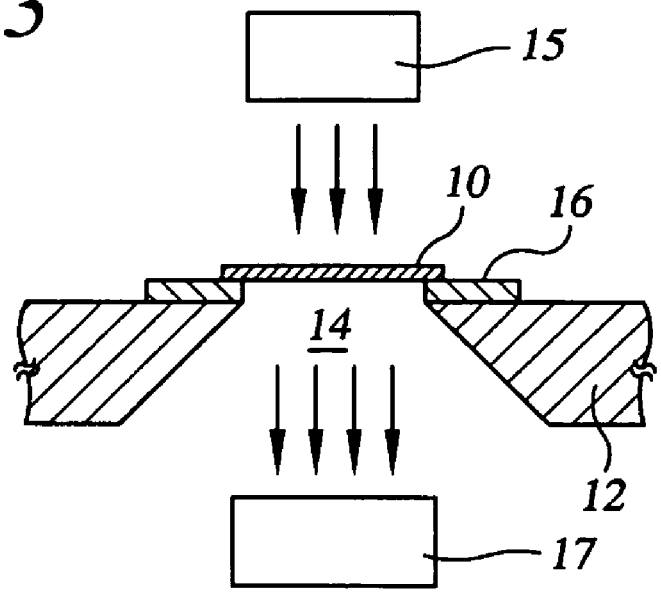
FIG. 3 is a schematic cross-sectional view of the nanotube configuration of FIGS. 2A-2B, here employed in TEM analysis of the nanotube.

Referring to FIG. 3, in accordance with the invention, a substrate 12 having a nanotube suspended across an aperture 14 in the substrate can be positioned between an electron beam source 15 and a detector 17, i.e., with the aperture 14 in the electron beam path to the detector 17. Trajectory of the electron beam through the nanotube 10 and through the substrate aperture 14 to the detector enables TEM analysis of the nanotube in situ, i.e., at its synthesized, intended location on the substrate. It is generally recognized that nm-scale TEM resolution is required to enable sufficient precision in nanotube analysis. The substrate aperture configuration provided by the invention enables such TEM resolution with a substrate arrangement that is easily positioned for analysis without destruction of a nanotube under investigation.

Figure 4A:
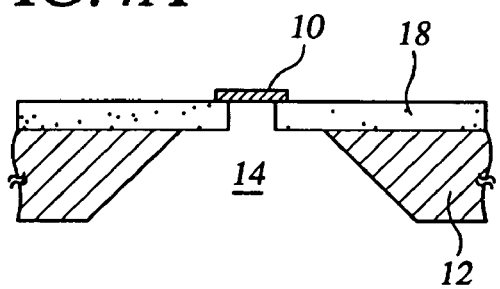
FIGS. 4A-4B are schematic cross-sectional and planar views, respectively, of a carbon nanotube provided in accordance with the invention suspended over an aperture in a membrane.
Figure 4B:
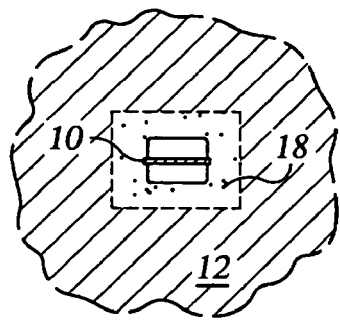

The invention contemplates a wide range of alternative structures in which an aperture can be provided for enabling a suspended nanotube configuration. For example, referring to FIGS. 4A-4B, there can be provided an aperture 14 in a membrane 18 that is disposed on a surface of a substrate 12. The nanotube 10 is provided across the aperture in the membrane. The cross sectional view of FIG. 4A is not shown to scale for clarity; the membrane thickness can be of a selected suitable thickness, and the substrate need not be of a specific thickness.

Figure 5A:
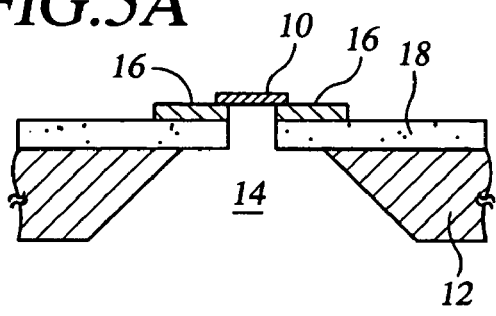
FIGS. 5A-5B are schematic cross-sectional and planar views, respectively, of a carbon nanotube provided in accordance with the invention suspended over an aperture in a membrane and connecting two electrically conducting contact pads.
Figure 5B:
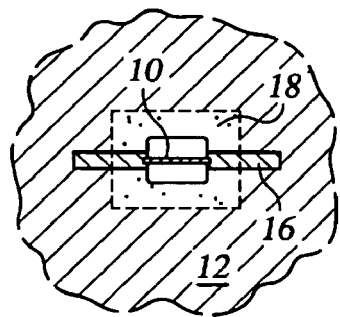

Referring also to FIGS. 5A-5B, as in the substrate configuration of FIGS. 2A-2B, there can here be provided electrically conductive contact pads or strips 16 at peripheral locations around the aperture 14 in the membrane 18. The suspended nanotube 10 then can be configured to bridge the contact pads across the aperture.

It is to be recognized in accordance with the invention that the example nanotube configurations described above can be adapted as needed for a given application. For example, the substrate can be provided as any suitable material and can consist of multiple composite material layers. Similarly, a substrate surface membrane can be provided as any suitable material and can consist of multiple membrane material layers as-required for a given application.

The electrically conducting contact pads or strips can be provided of any suitable conducting material that is compatible with the nanotube synthesis process, as described below, to enable formation of a nanotube that is disposed on top of the pad, i.e., that contacts the top surface of the contact pad or strip. There is no required pad shape or pattern, but preferably an edge of each contact pad coincides with the periphery of the aperture across which a nanotube is to be synthesized. The contact pads can make electrical connection to circuitry that is provided on the substrate or to locations for connection with external circuitry. Indeed, the contact pads are shown in the figures as isolated structures only for clarity; it is understood in accordance with the invention that the contact pads can be provided in a range of configurations to make connection to other circuits and/or devices.

Figure 6:
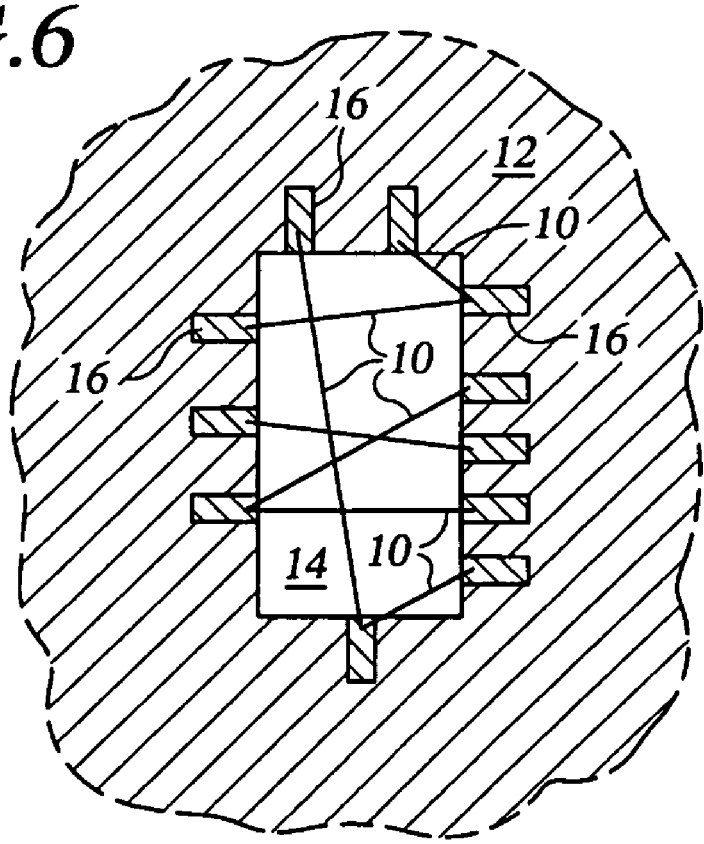
FIG. 6 is a schematic planar view of multiple carbon nanotubes provided in accordance with the invention suspended over an aperture and connected multiple electrically conducting contact pads.

FIGS. 1A-4B illustrate a single nanotube for clarity, but in accordance with the invention, multiple nanotubes can be provided across a single aperture and between multiple contact pads. Referring to FIG. 6, an example configuration of such is shown, with several nanotubes 10 spanning an aperture 14 in a substrate 12. In fact, arrays of nanotubes can be provided across an aperture between multiple pairs of contact pads, and can make contact between several pads. As shown in the figure, contact pads can be located at various points around the aperture periphery, with nanotubes connecting a variety of the pads. As explained in detail below, during the nanotube growth process, electric fields can be applied selectively between particular contact pads to direct the growth of nanotubes between designated contact pads.

The nanotube configurations of FIGS. 1A-2B and FIGS. 4A-5B can be fabricated by any suitable synthesis process that accommodates production of an aperture in a structure that is to support the nanotubes and preferably in addition to support electrical contact pads to which the nanotubes are connected. The invention provides a process sequence that can be particularly advantageous for controllably producing single-walled nanotubes that span an aperture in a support structure. While this example process described below can be preferred for many applications, it is to be recognized that other fabrication processes and nanotube synthesis techniques can also be employed.

Figure 7A:
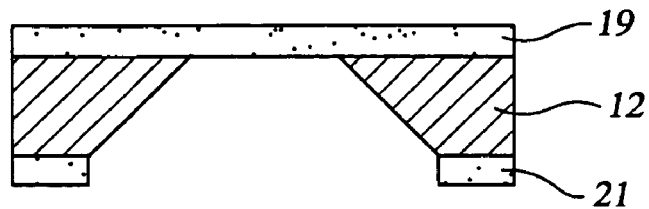
FIGS. 7A-7D are schematic cross-sectional views of a microfabrication process provided by the invention for producing the carbon nanotube configuration of FIGS. 5A-5B.

Referring to FIG. 7A, in an example fabrication process, there is provided a substrate 12 of a selected material, e.g., silicon, alumina, sapphire, or other selected material. The selected substrate material preferably is not deleteriously affected by the nanotube synthesis temperature, and preferably does not diffuse into layers that may be applied to the substrate. If a membrane is to be fabricated on the substrate, then a membrane layer 19 is formed, on the front surface of the substrate, and e.g., a corresponding layer 21 is also formed on the back substrate surface. For example, given a silicon substrate, a membrane layer of silicon nitride or silicon dioxide, e.g., of about 500 nm in thickness, can be formed on both silicon substrate surfaces in the conventional manner, e.g., by low pressure chemical vapor deposition (LPCVD).

While the figures illustrate formation of a membrane on a substrate, it is to be recognized that such is not required by the invention; a substrate having an aperture formed directly there through can alternatively be employed. No particular substrate configuration is required by the invention; any suitable support structure can be employed as may be suited to a given application.

If a membrane is to be produced, a region of the membrane layer 21 on the back substrate surface is then patterned and etched, e.g., by reactive ion etching, to remove a portion of the membrane layer 21 to expose the substrate surface for production of a suspended membrane at the front surface of the substrate. The substrate is then etched through its thickness to the membrane layer 19 at the front surface of the substrate to produce a free-standing membrane; for many applications, a membrane extent of, e.g., about 100 μm can be suitable. Given a silicon substrate, silicon etch techniques, e.g., anisotropic wet etching by KOH, can be employed in the conventional manner. At the completion of the substrate etch, the configuration of FIG. 7A is produced, and the backside layer 21 can be removed if desired. If a substrate is to be employed without a membrane layer, then the formation of membrane layers 19, 21 is not required, and bulk etching of the substrate is preferably carried out to form a thinned substrate front surface region at the location corresponding to the membrane layer 19.

Figure 7B:
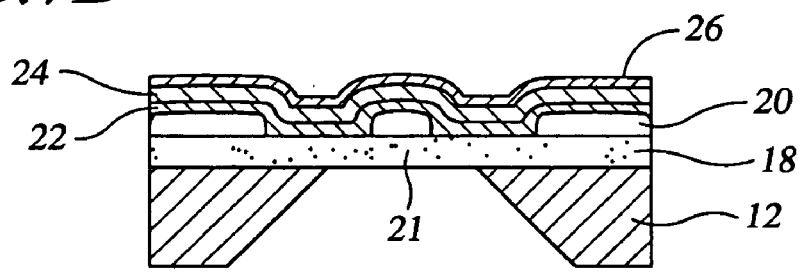

Referring to FIG. 7B, given a free standing membrane 18 produced by the previous steps, then in a next step of the process, one or more metal layers can be deposited for forming electrically conducting contact pads on the substrate or membrane surface, if contact pads are desired for a given application. Patterning of the metal contact pad layer can be carried out using a photoresist lift-off process or other suitable technique. For example, as shown in the figure, a photoresist layer 20 can be deposited and patterned and metal layer or layers 22, 24, blanket-deposited over the patterned photoresist. As shown in FIG. 7B, the patterned photoresist layer 20 preferably defines the contact pad areas and a central area 21 that is between the contact pad locations and is the location at which the aperture is to be formed. For many applications, it can be preferred for the contact pads to extend several microns or less.

In one metal layer deposition process example, a layer of Cr is deposited as a first metal layer 22, of, e.g., about 15-50 nm in thickness, to serve as an adhesion layer, and a metal electrode material layer of Pt of, e.g., about 50 nm in thickness is then deposited as a second metal layer 24. Any suitable metal or composite of metals can be employed, so long as the selected material can withstand a subsequent heat cycle for nanotube synthesis. Conventional metal electroplating processes, or other selected metal deposition process can be employed.

In this example, the metal layers are deposited on a membrane 18. If metal contact pads are to be included, it is preferred in accordance with the invention that the membrane material be electrically insulating such that the metal contact pads are discretely electrically isolated. Similarly, if a substrate surface itself, rather than a membrane, is to be employed for nanotube synthesis, then the substrate surface preferably is electrically insulating. Given a semiconducting substrate of, e.g., silicon, or a membrane material of, e.g., silicon or polysilicon, it can be preferred to provide this condition with an insulating layer, e.g., of silicon dioxide or silicon nitride, on the substrate or membrane surface prior to metal contact pad formation.

Referring to FIG. 7B, for many applications, it can be convenient at this point in the fabrication sequence to also deposit a layer 26 of nanotube synthesis catalyst material on top of the electrode material, prior to lift-off patterning of the electrode material layer. In accordance with the invention, the nanotube catalyst layer can be formed in any convenient manner, of a suitable material. A nanotube catalyst of layer of, e.g., Fe, Co, Ni, or alloys of such are understood to be most effective for many applications.

The invention provides a preferred catalyst deposition process that is understood to enable precise control of catalyst properties, and correspondingly precise control of nanotube growth, such that single-walled nanotubes oriented horizontally, parallel to a support surface, are selectively synthesized. In this process, the catalyst layer is formed by vapor deposition of a solid catalyst material, by sputtering, molecular beam epitaxy, sol gel formation, E-beam evaporation, thermal evaporation, or other selected vapor deposition process. Whatever vapor deposition process is selected, it preferably is controlled to enable very low coverage of the vapor-deposited film, such that no more than several monolayers of the selected catalyst material are deposited on the membrane or support substrate.

In one example vapor deposition process, thermal evaporation of Fe using a tungsten boat spot welded with Fe foil can be carried out under vacuum conditions, e.g., at a pressure of about $10^{-5}$ or $10^{-6}$ Torr, to produce a Fe catalyst layer of selected thickness. Whatever catalyst material and vapor deposition process is employed, it is preferred in accordance with the invention that the resulting catalyst layer thickness be less than about 2 nm, or considered another way, it is preferred that the catalyst layer be characterized by a layer coverage of about $17 \times 10^{15}$ atoms/cm$^2$ or less. It is understood that as the catalyst layer thickness is increased, the diameter of nanotubes that are horizontally synthesized from the catalyst layer correspondingly increases, and above a threshold catalyst layer thickness, multi-walled, rather than single-walled, horizontal nanotubes are formed.

For applications in which single-walled nanotube synthesis is desired, the invention provides the specification of a thin catalyst layer, e.g., of 2 nm in thickness or less, for predictably and reliably forming single-walled nanotubes. If a given application does not absolutely require the production of single-walled nanotubes, then the thickness of the catalyst layer is not critical, but it is to be recognized that above a critical thickness, the catalyst layer will not support synthesis of horizontal nanotubes, and thus, to ensure horizontal nanotube synthesis across an aperture in accordance with the invention, a relatively thin catalyst layer can be preferred.

Referring back to FIG. 7B, in one example fabrication sequence, once a catalyst layer 26 is formed on top of a metal layer or layers 22, 24, then by using lift-off techniques, the patterned photoresist layer 20 is removed, resulting in patterned catalyst/electrode regions. This technique can be particularly advantageous because it enables patterning of both electrode and catalyst layers in a single step. For applications in which it is acceptable for the extent of catalyst regions to coincide with that of electrode contact pads, this process can therefore be preferred.

If for a given application, it is preferred that the catalyst regions do not fully cover the contact pads, then an additional lithographic and etch sequence can be carried out to remove catalyst material from portions of the contact layer. In one example process, the catalyst layer is masked with, e.g., a patterned photoresist layer, exposing regions of the catalyst layer that are to be removed. A dry etch process, e.g., plasma etching, ion beam etching, or other technique, is then employed to remove the unwanted catalyst layer regions. It is recognized that many catalyst layer etch processes may not be significantly selective in etching the catalyst material over the underlying metal electrode material. It therefore can be preferred that the catalyst etch process be controlled as a timed process or with other controls to ensure that the integrity of the metal contact pad material is maintained.

Figure 8A:
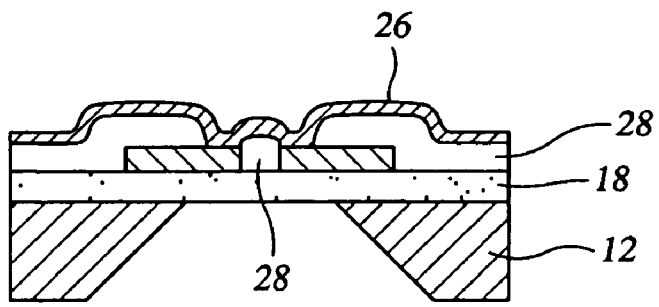
FIGS. 8A-8B are schematic cross-sectional views of microfabrication process steps that can be employed as an alternative to that of FIG. 7B.
Figure 8B:
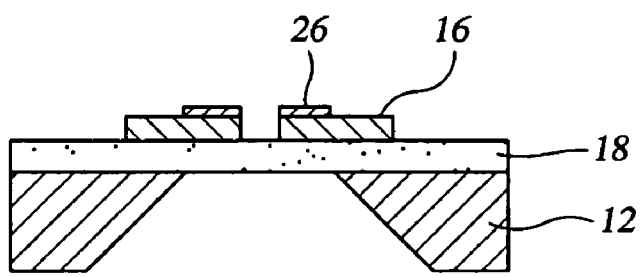

In an alternate process, the catalyst layer can be patterned and etched in a sequence of steps separate from that employed for the electrode layer. For example, the electrode layer can be patterned by, e.g., a lift-off process as just described, and then the catalyst layer deposited and patterned by a second separate lift-off process. Referring to FIG. 8A, in this scenario, a photoresist layer 28 is formed over the produced contact pads 16 and the designated location for the aperture and patterned to expose regions of the contact pads at which it is desired to provide a region of nanotube catalyst layer. The catalyst layer 26 is then blanket-deposited, preferably by a selected vapor deposition process like that described above. Referring to FIG. 8B, lift-off of the photoresist layer 28 is then carried out to remove portions of the catalyst layer, resulting in a patterned catalyst region atop the contact pads.

It is not required that the catalyst layer be patterned by a lift-off process; instead, the catalyst layer can be blanket-deposited on the contact pads and then etched, e.g., by lithographic patterning of a photoresist layer applied on top of the catalyst layer and patterned to define distinct catalyst islands. Etching of the catalyst regions exposed through the photoresist pattern can then be carried out employing a suitable etch process. This approach, like the catalyst lift-off approach, has the advantage of enabling precise formation of catalyst islands that do not necessarily extend across an entire electrode contact pad, and therefore that more precisely define the location of nanotube synthesis.

Whatever process sequence is employed to produce contact pads and catalyst regions, it can be preferred in accordance with the invention to define their locations as shown in the example of FIGS. 7 and 8, with the membrane or substrate location at which an aperture is to be formed left uncovered by metal and catalyst materials. This scenario enables the use of an aligned mask to etch an aperture between the contact pads right at the edge of the contact pads and catalyst regions, resulting in the structure of FIG. 7C.

Figure 7C:
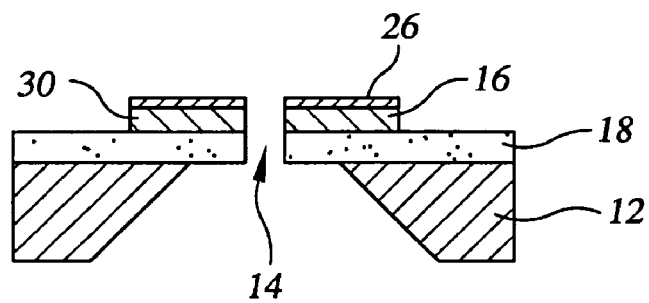
Figure 9:
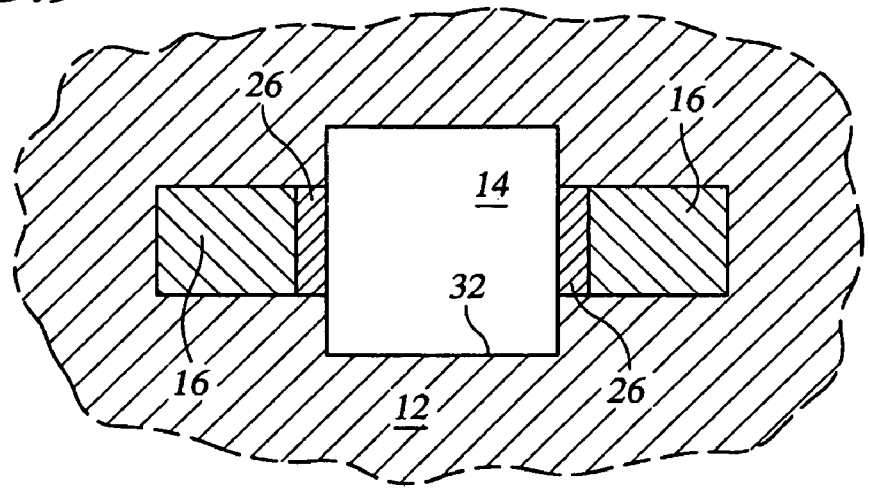
FIG. 9 is a schematic planar view of an example nanotube catalyst and contact pad configuration provided by the invention.

Alternatively, the contact pad and catalyst regions can be extended across an intended aperture location, such that production of an aperture through the contact pad and catalyst layers enables self alignment of the contact pads and catalyst regions with edges of the aperture. This results in production of two contact pads that are separated by the aperture, as shown in FIG. 7C. FIG. 9 provides a planar view of one example of such a preferred structure, with two contact pads 16 separated by the aperture 14, with the contact pads abutting the edge 32 of the aperture. This illustrated structure can be formed in any suitable manner, and the invention is not limited to a particular technique for producing this structure. Any convenient process that enables alignment of catalyst regions and contact pads with edges of an aperture can be employed.

Also shown in the configuration of FIG. 9 is a condition in which catalyst layer regions 26 abut the aperture edge 32 and do not extend across the expanse of the contact pads. Such a condition can be produced by the various catalyst layer etch sequences just described. Whatever catalyst pattern is desired, it is preferably produced in accordance with the invention by a lithographic process that enables precise definition of the location and extent of catalyst regions. This lithographic catalyst definition, in combination with vapor deposition of a thin catalyst layer, enables precise nanotube synthesis.

Figure 10:
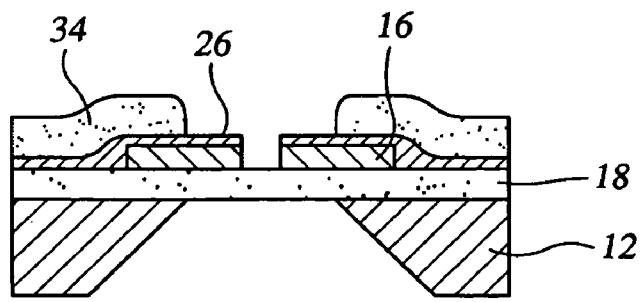
FIG. 10 is a schematic cross-sectional view of a nanotube catalyst layer configuration provided by the invention.

Referring also to FIG. 10, this preferable lithographic definition of the catalyst regions does not require etching of the catalyst layer. For example, as shown in the figure, a blanket deposition of catalyst layer 26 can be carried out in the manner described above, and then a capping layer 34 can be deposited and patterned. The capping layer pattern exposes regions of the catalyst layer at which it is desired to synthesize nanotubes, with the remainder of the catalyst layer being covered to inhibit nanotube synthesis. With this configuration, the catalyst layer is not itself etched, but through lithography the precise location of catalyst exposure for nanotube synthesis is accomplished.

Turning back to FIG. 7C, once the catalyst layer regions 26 are formed at selected sites on contact pads 16, an aperture is formed through the membrane 18 or other support structure on which nanotubes are to be provided. In one example process, the membrane or substrate is lithographically masked and then etched with a suitable etchant, e.g., a plasma etch, with the adjacent contact pad and catalyst layer regions masked from the aperture etch. Lithographic patterning of each layer to be etched can be carried out in sequence, with one or more layers etched together as possible by a given etch recipe. Alternatively, focused ion beam milling of the catalyst, contact pad, and membrane materials can be carried out directly, in the manner described previously, to enable self alignment of the various layers with the aperture. The resulting structure, as in FIG. 7C, provides an aperture 14 with contact pads 16 and catalyst regions 26 in alignment. A plurality of apertures can be formed in a given substrate, membrane, or other support structure, in arrays or other configuration suitable for a given application.

Figure 7D:
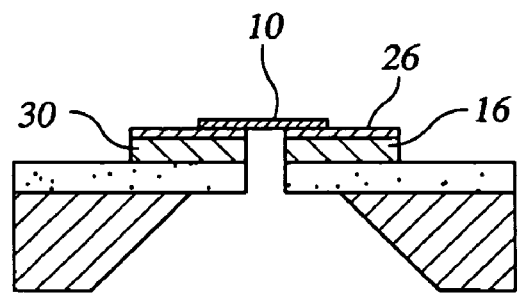

Once selected apertures are produced, nanotube synthesis can be carried out on the substrate or membrane. Referring to FIG. 7D, the nanotube synthesis is particularly carried out to produce one or more nanotubes 10 bridging each aperture to connect to edges of the aperture or to contact pads 16 in the manner shown. In one example synthesis process, nanotube growth is carried out in a suitable system, e.g., a furnace system. A substrate on which nanotube growth is desired is loaded into the furnace system and the temperature of the system is raised to the desired growth temperature, which can be, e.g., between about 600° C.-1500° C., and preferably is about 900° C. During the temperature ramp, it can be preferred to provide a flow of an inert gas, e.g., argon, to suppress oxidation of the contact pad material, catalyst material, membrane and/or substrate material, and other materials included in the configuration.

When the desired synthesis temperature is reached, the gas flow is switched to a hydrocarbon gas, e.g., a methane gas flow. The methane gas flow is preferably maintained at between about 100 sccm and about 400 sccm, with a flow rate of about 200 sccm preferred. With this relatively low gas flow, it is found in accordance with the invention that amorphous carbon formation on and around synthesized nanotubes and the substrate area is substantially inhibited. As a result, in accordance with the invention there is no need for inclusion of hydrogen or other gas flow in addition to the methane to inhibit amorphous carbon formation. The suppression of amorphous carbon formation during the nanotube synthesis process also eliminates the need for post-growth purification processes; as-grown nanotubes can be directly employed. It is understood in accordance with the invention that the influence of gas flow direction on the orientation of nanotubes as they are synthesized is negligible, and therefore that no particular orientation of substrates with respect to gas flow is required.

The methane gas flow exposure of the catalyst material can be carried out for any duration required for a given application to produce nanotubes of selected diameter and quantity. For many applications, it can be preferred to carry out the methane gas flow exposure for 10 minutes or less to repeatably synthesize single-walled nanotubes at significant yields and good quality. If such is not a requirement, the gas flow can be continued for any selected duration depending on the desired yield of nanotubes. It is found, however, in accordance with the invention, that minimization of nanotube synthesis time can be preferred in that such reduces the production of amorphous carbon on the nanotubes and surrounding structures.

It is understood in accordance with the invention that the low-coverage catalyst layer prescribed by the invention produces in the high-temperature synthesis process catalytic nanoparticles at which nanotube growth is initiated. More specifically, nanoscale catalyst particles nucleate from the catalyst layer regions during the high-temperature synthesis process. These nanoscale particles are sites at which single-walled nanotube growth is initiated. Thus, single-walled nanotube synthesis can be automatically and selectively enforced by the use of the low-coverage catalyst layer of the invention, with nanometer-scale synthesis sites produced during the high-temperature synthesis step. If desired, prior to the methane gas synthesis flow step, a first high-temperature annealing step can be included, preferably in argon or other inert gas flow, to pre-nucleate the catalyst regions. Such an anneal step can be carried out, e.g., at the same temperature to be employed for the synthesis step, or at another selected temperature, for a reasonable time.

During the methane gas flow, an electric field can be applied across an aperture to aid in directional synthesis of nanotubes across the aperture. For example, a voltage can be applied between contact pads at edges of the aperture or a contact pads provided a distance from the aperture specifically for electric field application, as-desired. The selected voltage bias preferably takes into account the distance between contact pads for producing a desired electric field. A bias of, e.g., 0.5 V/µm of distance between contact pads is sufficient for inducing directionality in the nanotube synthesis, whereby the nanotubes align with the field direction, due to a torque on an induced dipole moment of a nanotube by the applied electric field. As described previously, an electric field can be applied to enable nanotube synthesis in one or more selected directions across an aperture.

A silicon nitride membrane having electrically conducting contact pads and a nanotube synthesis catalyst region adjacent to an aperture was fabricated in the manner described above and illustrated in FIGS. 7A-7D. Employing a single lift-off process, two 2 µm-wide contact pads formed of a 50 nm-thick layer of Cr and a 50 nm-thick layer of Pt were formed, with an Fe catalyst layer of $5 \times 10^{15}$ atoms/$cm^2$ coverage thermally evaporated atop the contact pad layer. A focused ion beam milling process was employed to mill an aperture through the catalyst layer, the contact pad layers, and the silicon nitride membrane. Nanotube synthesis was then carried out in a 200 sccm flow of methane gas of at a temperature of 900° C. for—less than 5 minutes for various samples.

With these synthesis conditions, it was found that one or a few single-walled nanotubes were formed suspended across each aperture between electrodes and the overlying catalyst layer, as determined by TEM carried out directly on the as-grown nanotubes at their synthesized locations. Electrical measurements were made on the as-grown samples, without any post-growth electrical contacting process. It was found that amorphous carbon made no contribution to the measured electrical properties of the nanotube structures.

Figure 11:
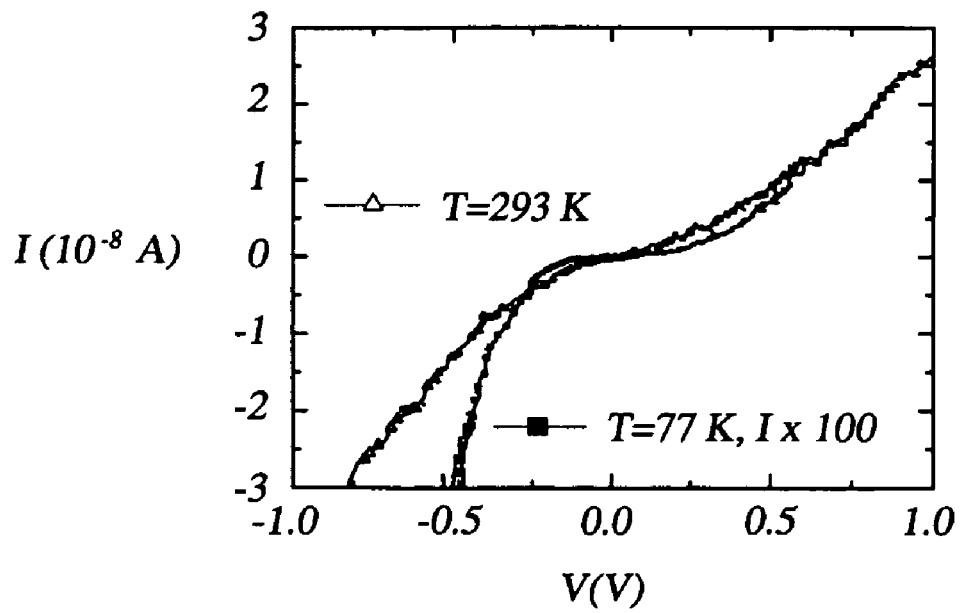
FIG. 11 is a plot of experimentally measured current as a function of voltage for an experimentally fabricated semiconducting single-walled carbon nanotube produced in accordance with the invention.

FIG. 11 is a plot of current as a function of applied voltage between two contact pads connected by a single-walled nanotube bridging an aperture between the contact pads. In this sample, the single-walled nanotube is semiconducting. At room temperature, the low-bias differential resistance was ~100 MΩ, and bandgap-related nonlinearity was already visible. An asymmetry appears, which is most likely due to a contact difference between the two ends of the nanotube.

Figure 12:
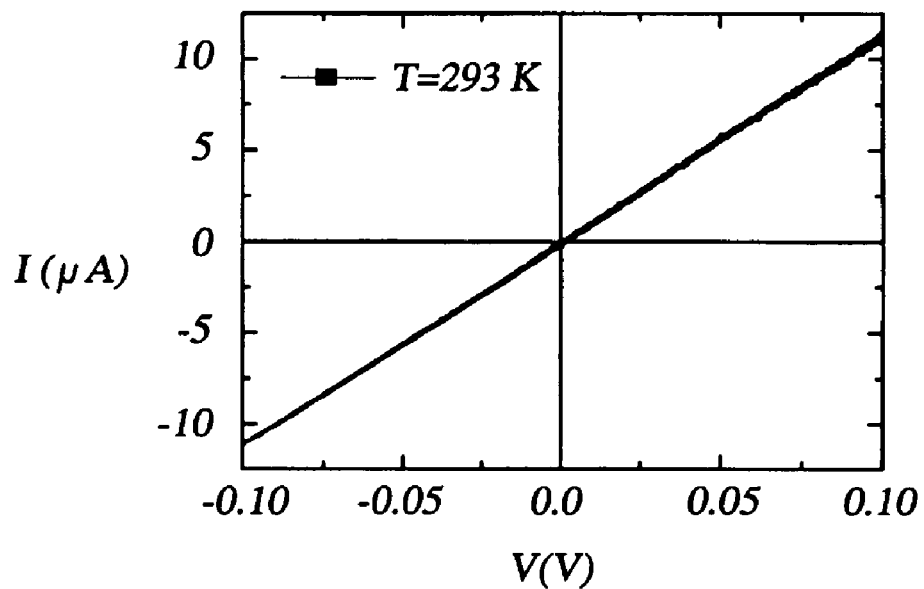
FIG. 12 is a plot of experimentally measured current as a function of voltage for an experimentally fabricated metallic single-walled carbon nanotube produced in accordance with the invention

When the temperature was reduced to 77 K, a gap is clearly observed in the I-V curve. Assuming two Schottky barriers in series at the two contacts between the semiconducting nanotube and the electrodes, the energy gap of the nanotube is determined to be about 0.25 eV, which is half the plateau of the I-V curve. Gap values of up to about 0.9 eV were determined for other semiconducting single-walled nanotubes in other samples, which corresponds to a tube diameter of about 0.9 nm. FIG. 12 is a plot of current as a function of applied voltage, at room temperature, between two contact pads connected by a metallic single-walled nanotube bridging an aperture between the contact pads. The linear resistance for this metallic sample was determined to be ~10 K$\Omega$.

The controlled growth of single-walled nanotubes across apertures and between electrical contact pads as enabled by the invention addresses a wide range of applications, including sensing, mechanical and electronic applications. For example, a nanotube suspended across an aperture can be employed as a chemical or other sensor in which a species under investigation is passed through an aperture across a nanotube. In addition, crossed nanotubes bridged by appropriate molecules can provide true single molecule negative differential resistance (NDR) device capabilities.

The nanotube synthesis process of the invention is highly compatible with, and adaptable to, standard semiconductor microfabrication techniques, including lithographic patterning techniques. It therefore enables the adoption of carbon nanotubes in large scale applications that require integration with silicon-based design and microfabrication processes. Further, because only standard process techniques are employed, no unconventional equipment or process control is required.

For many applications, the coating of carbon nanotubes with one or more materials is of great importance. For example, the coating of nanotubes with various materials can enable production of, e.g., nanowires of those materials. In addition, because the physical properties of exposed nanotubes are sensitive to the surrounding environment it is often desired to provide passivation coatings on nanotubes that are to be employed in practical devices. For example, the coating of nanotubes with a dielectric, i.e., an electrically insulating material, can be important for fabricating nanotube-based electronic devices.

The invention provides a range of techniques for coating individual nanotubes, and in particular suspended nanotubes, that as-coated can form the foundation of nanotube-based electronic devices. The example nanotube synthesis methods described above can be employed in accordance with the invention for producing nanotubes to be coated with one or more materials. Beyond the specific examples given above, the invention contemplates the synthesis of single-wall or multi-wall nanotubes, in either case which can be electrically conducting, i.e., metallic, or electrically semiconducting. The nanotubes can be synthesized in any convenient fashion, employing suitable synthesis techniques. For many applications, a chemical vapor deposition (CVD) environment of methane gas in which a nanotube catalyst material such as Fe is exposed can be preferred, in the manner detailed above.

Figure 13:
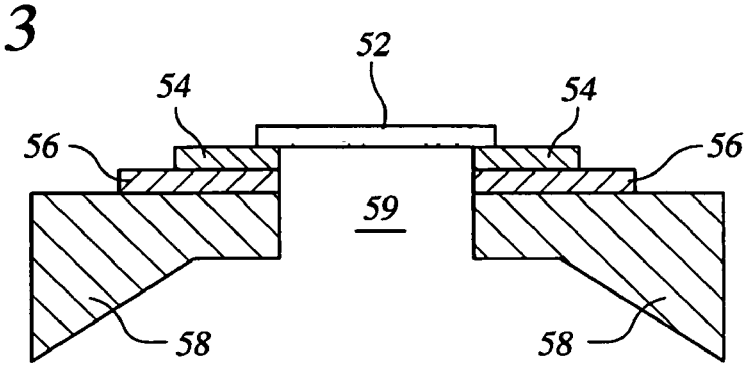
FIG. 13 is a side view of a suspended nanotube configured with source and drain electrodes for forming a nanotube FET.
Figure 14:
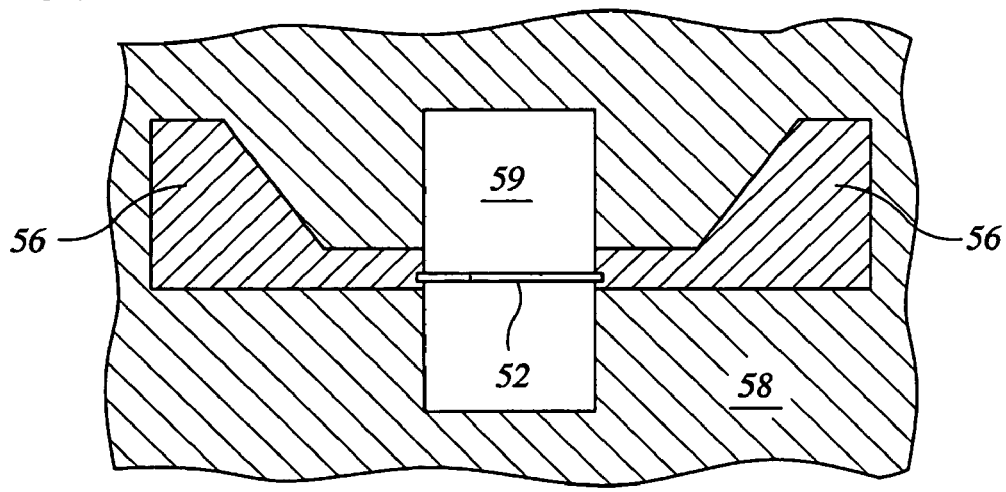
FIG. 14 is a top-down planar view of the nanotube configuration of FIG. 13.

Whatever nanotube synthesis technique is to be employed, it can be preferred in accordance with the invention to position the nanotube catalyst material on a support structure such that the nanotube synthesis process results in production of a nanotube that is suspended between two support surfaces over an aperture, gap, trench, slit, throughhole or other separation of the two support surfaces. FIG. 13 is a side view of a schematic example of such a structure 50 and FIG. 14 is a top down planar view of the structure. Here is provided a substrate 58 having an aperture 59 through the thickness thereof. On one surface of the substrate is provided metal electrodes 56 to be employed in operation of a nanotube device. A nanotube catalyst layer 54 is provided on top of at least a portion of the electrodes. The catalyst is preferably formed, in accordance with the invention, by deposition and photolithographic patterning techniques, enabling precise formation and positioning of the catalyst as, e.g., catalyst islands, in the manner described above, and of a thickness conducive to nanotube synthesis across the aperture. With this catalyst configuration, a nanotube 52 can be synthesized across an aperture, e.g., bridging two metal electrodes as described above.

It is to be recognized in accordance with the invention that given a CVD nanotube synthesis technique, the nanotube catalyst can be positioned in a range of configurations with respect to metal electrodes to be employed in a nanotube device. For example, the catalyst can be provided on top of electrodes, as shown in FIGS. 13-14, and in this scenario can extend across a portion or the full extent the electrodes, or can extend beyond an edge or edges of the electrodes. The catalyst can also be provided immediately adjacent to electrodes, in contact with the electrodes. Given a nanotube device configuration in which a nanotube is to bridge electrodes across an aperture, it is understood that the nanotube catalyst configuration preferably selectively encourages nanotube growth across the aperture. It is understood that very thin catalyst islands formed in the manner described above preferentially encourage lateral nanotube growth and further, that nanotube growth from large planar regions at the interior of a catalyst island will not likely result in a nanotube bridge across an aperture. The positioning of an edge of a thin catalyst region adjacent to an aperture is therefore preferred for synthesizing a nanotube across the aperture.

The example nanotube-based structure of FIGS. 13-14 can be employed in a wide range of applications and is particularly amenable to coaxial coating of the circumference of a nanotube, along the entire length of the nanotube. By coaxial coating is meant coating around the entire circumference of the nanotube, along its longitudinal axis. For example, the nanotube can be coaxially coated with one or more electrically insulating materials and one or more electrically conducting materials to form a field effect transistor (FET) in which the two metal electrodes in the figures operate as source and drain of the transistor, an electrically insulating material coated on the nanotube operates as a gate dielectric, and an electrically conducting material on the dielectric-coated nanotube operates as a gate, whereby the nanotube operates as a transistor channel.

With this example, the invention provides a three-step sequence for producing a nanotube-based device. In the first step, a nanotube is synthesized in-place in a desired device configuration in the manner given above. It is preferred in accordance with the invention that the synthesized nanotube be suspended. In the second step, the nanotube is coated with one or more materials as-prescribed for a given nanotube device configuration and operation. In the third step, fabrication processes, if any, that are required for completion of the nanotube device, are carried out with the coated nanotube in place in the device configuration.

Turning to processes provided by the invention for the coating of a carbon nanotube, here specifically configured as a suspended nanotube, a wide range of coating techniques and coating materials can be employed. In a first coating technique provided by the invention, a suspended nanotube, as-formed in a selected device configuration, e.g., bridging two electrodes across the extent of an aperture, is exposed to a chemical vapor deposition (CVD) environment for coaxial coating the full circumference of the nanotube with a selected material. It is understood that the high pressure typically employed with conventional CVD processes can result in lower quality device materials; therefore, low pressure chemical vapor deposition (LPCVD) is preferred in accordance with the invention but conventional CVD processes can also be employed if the resulting device quality is acceptable for a given application. Plasma enhanced chemical vapor deposition (PECVD) can also be employed. Like conventional CVD, PECVD is not preferred in accordance with the invention because such is understood to potentially damage exposed device materials, as well as the nanotube itself, by ion bombardment resulting from the plasma. But PECVD can be preferred because it enables a reduction in deposition temperature.

CVD techniques can be employed to coat nanotubes with any of a wide range of materials. For example nanotubes can be coated with nitrides, such as Si3N4; oxides, such as a layer of SiO2, Ta2O5, SiOxNy generally, SrTiO3, as well as BaTiO3, Sr1-xBaxTio3, Y2O3, La2O3, or TiO2; polysilicon or other semiconducting material; metals; or other selected material, by LPCVD or other CVD process, or by physical vapor deposition (PVD).

For many applications, LPCVD coating of a selected material can be preferred. In an example LPCVD process for producing a silicon nitride nanotube coating, a mixed flow of gases including $SiH_2Cl_2$, flowing at about 100 sccm, and $NH_3$, flowing at about 140 sccm, is employed at a temperature of about 720° C. and a pressure of about 1 Torr. These deposition conditions result in a silicon nitride growth rate of about 2.5 nm per minute of reaction time, as measured on a planar substrate.

As will be understood by those skilled in the art, a wide range of CVD process parameters can be employed. For example, the CVD temperature to be employed can range between about 100° C. and about 1200° C., depending on the other process parameters. At the low end of the temperature range, plasma enhancement of the CVD environment can be employed to enable the formation of a coating. The high end of the CVD temperature range is set by the properties of the carbon nanotube and other materials that will be subjected to the CVD environment; the temperature should not exceed that at which a material will melt or otherwise be deleteriously affected. It is preferred in accordance with the invention that whatever CVD temperature is selected, the nanotube configuration be subjected to an inert gas environment as the temperature is ramped. For example, nitrogen gas can be flowed in the CVD chamber during the temperature ramp-up to an intended deposition temperature.

Considering other CVD process parameters, in accordance with the invention, the CVD pressure can range between, e.g., about 0.1 T and about 3 T, depending on the deposition rate and reaction times required for a given application. Similarly, the flow rates of selected precursors employed in a CVD process can be selected in the conventional manner to enable a deposition rate and reaction kinetics that are suitable for a given application. Whatever process parameters are selected, it is understood in general that CVD processes enable coating of a suspended nanotube with a uniform thickness in a controlled and reproducible manner. LPCVD processes can be particularly preferred as such are understood to not damage nanotubes or electrodes.

In a second technique provided by the invention for coating a nanotube, and particularly a suspended nanotube, atomic layer deposition (ALD) can be carried out on a nanotube. Atomic layer deposition of a wide range of materials can be carried out, including, e.g., oxides, such as $Al_2O_3$, $HfO_2$; $SrTiO_3$, $BaTiO_3$, $Sr_{1-x}Ba_xTiO_3$, $ZrO_2$, or other selected material. ALD can further be employed for producing a metal layer, such as Ti or Fe, or other suitable metal.

In an example ALD process in accordance with the invention for depositing a layer of $Al_2O_3$ on a nanotube, precursors of $Al(CH_3)_3$ and $H_2O$ can be employed at a processing temperature of about 250° C. It is preferred in accordance with the invention that at an initial step of ramping the temperature to the desired processing temperature, an inert gas such as nitrogen be supplied to the carbon nanotube in the ALD chamber. Once the desired processing temperature is reached, the ALD process is carried out in the conventional manner. For example, H2O vapor is first admitted to the chamber to form a monolayer of reactant, after which the H2O vapor is extinguished and a flow of $Al(CH_3)_3$ is commenced to react with the existing monolayer. Exposing the nanotube to a sequence of alternating precursor gases enables the precise deposition of atomic layers of a desired material, in this example $Al_2O_3$.

For many selected coating materials, it is found that ALD processing of a bare nanotube may not provide consistently superior results. Specifically, the atomic layer deposition process may not consistently enable production of a uniform, continuous, high-quality film around the circumference of a nanotube surface. It is understood that the self-contained tubular structure of a nanotube can limit the interaction of a nanotube surface with ALD precursors such as OH— groups, which initiate the ALD process of, e.g., $Al_2O_3$.

In accordance with the invention, this limitation can be overcome to enable ALD of a selected material on a nanotube by first coating the nanotube with a layer of a selected buffer material before ALD of an intended coating material. The buffer layer is selected to uniformly coat the nanotube with a buffer material that enables ease of ALD process initiation. For applications in which a buffer layer coating of a nanotube is to be employed, a suitable buffer layer material is one that can uniformly coat a nanotube. In accordance with the invention, metals, semiconductors, oxides, and nitrides can all be employed as buffer layers, and deposited in a convenient fashion. In general, in accordance with the invention, the selected buffer layer should easily stick to the nanotube surface and should provide good surface coverage around the circumference of the nanotube. It is found that metals such as Fe do not always interact sufficiently strongly with a nanotube to enable a uniform ALD coating. In contrast, metals such as Cr, Ti, and other metals do easily adhere to a nanotube surface and form a uniform coating, and therefore can be preferred.

Any suitable buffer layer deposition technique can be employed. For example, CVD and other deposition processes can be employed for coating a nanotube with a selected buffer layer. For many applications, a thermal evaporation of a metal buffer layer can be preferred because thermal evaporation of a metal buffer layer is a straightforward process. Although metal thermal evaporation techniques can be preferred, the invention does not require such, and other metal deposition techniques can be employed. In a metal thermal evaporation process, a source of melted metal material is provided in a thermal evaporation chamber, with the carbon nanotube suitably positioned for evaporation of the metal from the source onto the surface of the nanotube. Conventional evaporation techniques are found to work well with a nanotube configuration.

The thickness of a buffer layer is preferably selected based on the intended nanotube device operation and the desired interaction of the coating materials with the nanotube itself, in the manner described in detail below. For example, given a desired coating material of $Al_2O_3$, an initial buffer layer of Cr or Ti having a thickness of between about 0.5 Å and about 10 nm can be employed.

In accordance with the invention, thermal evaporation of a metal coating can also be employed for forming a gate electrode that uniformly coats the surface of a suspended nanotube. As described in more detail below, once a selected dielectric material, e.g., an oxide or nitride material, is formed on a suspended nanotube, then a gate electrode can be formed by thermal evaporation of a desired gate metal to a selected thickness. But it is understood in accordance with the invention that chemical vapor deposition can also be employed for forming a selected gate material, including, e.g., a polysilicon gate material or selected metal, on a suspended nanotube.

Turning to other coating techniques provided by the invention, it is recognized that once a metal layer is coated on a nanotube, the metal layer can be oxidized to produce an insulating coating on the nanotube. For example, first a layer of Cr or Ti can be thermally evaporated onto a nanotube to produce a metal coating layer. Then the metal-coated nanotube can be subjected to an oxidation environment, e.g., a flow of oxygen at an annealing temperature of, e.g., between about room temperature and the melting point of the metal, to oxidize the metal layer and produce an insulating layer.

For the example of a thermally-evaporated Cr layer, such oxidation can be employed to produce a layer of $Cr_2O_3$. For the example of a thermally-evaporated Ti layer, such oxidation can be employed to produce a layer of $TiO_x$. Other such metal oxides can similarly be produced. For example, a layer of $Al_2O_3$ can be produced by evaporation and oxidation. In this scenario, a layer of Ti, Cr, or other buffer layer is deposited on the nanotube, and then a layer of Al is evaporated on the nanotube. Subsequent oxidation of the Al layer can then be carried out to produce a layer of $Al_2O_3$. Similar approaches can be employed to produce other oxide layers or insulating compounds, e.g., $Fe_2O_3$, $CuO_x$, or other compound.

Beyond such vapor and thermal processing-based coating deposition techniques, the invention contemplates chemical reaction of suspended nanotubes with a coating chemical. In one example of such a chemical reaction, a suspended nanotube and its support configuration is submerged in a chemical bath for reaction with the bath. Such a reaction can be employed to enable nanotube coating with, e.g., silica or tin oxide, or other material.

In one example process for coaxially coating a suspended nanotube with a layer of silica, first a reactant bath is formulated by adding 3 grams of fumed silica to 50 mL of 3.20 M Fluorosilicic acid ($H_2SiF_6$) and enabling stirring of the solution overnight. The solution is then filtered, e.g., by vacuum through a 0.22 micron filter. The resulting filtrate is diluted to, e.g., about 1.0 M with, e.g., filtered water. One mL of the resulting solution is then added to 5 mL of an aqueous 1% sodium dodecyl sulfate (SDS) or 1% dodecyl trimethylammonium bromide (DTAB) solution in which is placed a structure including the suspended nanotube of interest. The nanotube is maintained in the solution while the solution is gently stirred and heated to a relatively low temperature, e.g., about 30° C.

In accordance with the invention, production of a nanotube coating by submersion of a nanotube in a reaction solution is preferably carried out by immersion of an entire substrate or other support structure, or by submersion of a previously etched substrate die. Care is to be taken when handling the support structures and when stirring the solution to maintain the integrity of the nanotubes.

The invention contemplates additional nanotube coating techniques, including physical vapor deposition techniques beyond the thermal evaporation techniques described above. For example, sputtering and laser evaporation coating techniques can also be employed, e.g., to produce a coating of $HfO_2$. A wide range of material targets can be employed.

With these processes for coating a suspended nanotube, the invention provides processes for producing n-type and p-type suspended nanotube FETs. Considering an example process for producing a p-type nanotube FET, in a starting structure 50 as shown in FIGS. 13 and 14, a suspended nanotube 52 has been synthesized in the manner given above on catalyst regions 54 provided at the location of metal source and drain regions 56 on a support structure 58. The suspended nanotube overlaps, and therefore contacts, the catalyst regions 54 and makes electrical connection, through the catalyst regions, to the source and drain regions 56. An aperture 59 extends completely through the support structure between a first surface at which the nanotube is provided and an opposite surface, enabling access to and interaction with the nanotube from both the front and back of the support structure.

The nanotube of this starting structure is first coated with a layer of a gate dielectric material, e.g., silicon nitride, formed by, e.g., the CVD process given above. In one example, with silicon nitride being provided as a gate dielectric, the thickness of the silicon nitride layer is selected in accordance with device design and operation. Whatever dielectric deposition technique is employed, the dielectric layer is to completely coaxially cover the entire length of the nanotube and to cover at least a portion of the source and drain regions. For many applications, it is preferred in accordance with the invention to employ a vapor deposition technique, such as CVD, that inherently enables this coaxial coating of the nanotube length.

If the deposition results in a blanket coating of the support structure around the nanotube, as well as the nanotube itself, it can be preferred to remove the coating from selected locations of the metal source and drain regions 56 to enable electrical contact to the FET device. More specifically, in a typical LPCVD process, the resulting layer blanket-coats the substrate, including the metal source and drain regions. It can therefore be preferred for many applications to lithographically pattern a masking layer, e.g., a layer of resist, exposing the deposited dielectric layer only at selected areas of the source and drain regions to remove the dielectric from those areas and thereby enable electrical contact to the source and drain.

In an example of such a process, a photoresist layer, e.g., a layer of Shipley 1818, is spun onto a semiconductor substrate including the dielectric-coated suspended nanotube, at a speed of, e.g., 3000 rpm. It is found that this photoresist spin application does not harm the nanotube across its bridging span and enables full coaxial coating of the nanotube with a photoresist layer. With the photoresist in place, conventional lithographic techniques can be employed to pattern the photoresist for exposing areas of the source and drain regions.

With the photoresist thusly patterned, a suitable etch technique can be employed for removing the dielectric material from selected areas of the source and drain regions. For example, given a silicon nitride dielectric coating, a reactive ion etch (RIE) can be employed, e.g., with a 50 sccm flow of $CF_4$, at a pressure of 100 mT, for removing the silicon nitride from the selected source and drain areas. Once the etch is complete, liquid acetone can be employed for removing the photoresist layer. In experimental work, it is confirmed that such etching and photoresist removal does not harm the coated, suspended nanotube and the acetone rinse effectively removes all photoresist from the surface of the coated, suspended nanotube.

It is to be noted that for many applications, if a layer of nanotube catalyst material, such as a layer of Fe, is provided over at least a portion of a source and drain electrode region as in the starting structure of FIG. 13, the catalyst layer can be retained and need not removed for FET operation. So long as the catalyst material is a good electrical conductor and does not significantly impact an ability to make electrical connection to the nanotube and source and drain regions, the catalyst layer can be left in place. In the example silicon nitride deposition process just given, Fe catalyst islands atop the source and drain electrodes can be retained in place; the removal of silicon nitride from the source and drain exposes the Fe layer on top of the electrode material.

As described above, for some materials and material deposition techniques, a uniform coating of a nanotube with a selected material cannot be guaranteed. If a selected gate dielectric material does not provide such a uniform coating, it is preferred in accordance with the invention to first provide an initial buffer layer on which the gate dielectric material is then deposited, in the manner described above.

Figure 15:
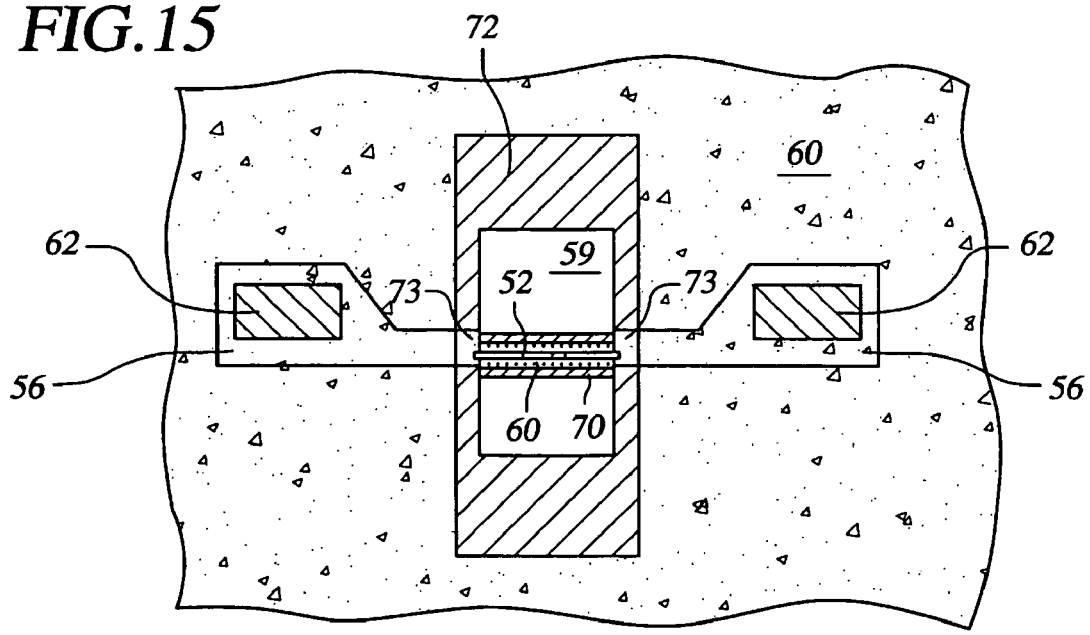
FIG. 15 is a top-down planar view of a nanotube FET including a gate dielectric material layer and a gate metal layer.
Figure 16:
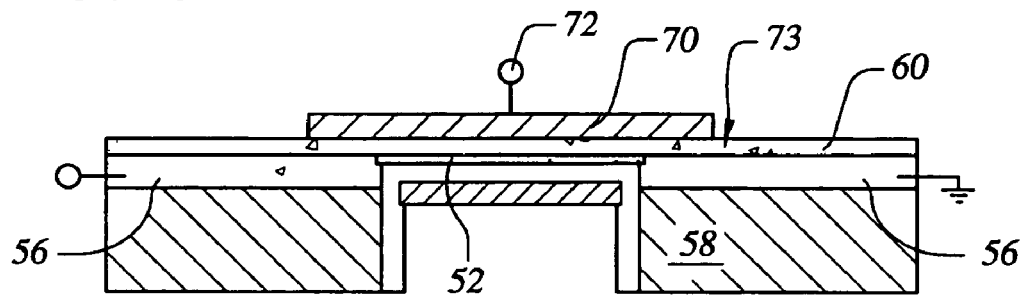
FIG. 16 is a cross-sectional view of the nanotube FET of FIG. 15.

Referring to FIG. 15, once a gate dielectric layer 60 is formed coaxially over the length of the nanotube and if necessary, the dielectric layer is removed to expose areas of the source and drain electrodes 56 on the substrate, then a gate electrode material 70 is deposited coaxially over the length of the suspended nanotube and patterned to form a gate electrode contact pad 72 on the support substrate. In accordance with the invention, the gate electrode material coaxially covers the entire length of the suspended nanotube and covers a portion 73 of the source and drain electrodes that are coated with the gate dielectric material. In FIG. 15 the nanotube is shown for clarity not to scale and in cross-section, with a dielectric layer 60 and a gate electrode layer 70 shown coaxially wrapping the circumference of the suspended nanotube along the entire length of the nanotube. FIG. 16 is a cross-sectional view through the nanotube and electrodes, making this coaxial configuration more clear, with the gate metal layer 70 shown extending the full length of the nanotube and overlapping the source and drain electrodes 56 in an overlap region 73 and separated from the electrodes in that region by the gate dielectric layer 60. For clarity, FIGS. 14-16 do not show the catalyst regions atop by the source and drain regions 56 but it is to be understood that such can be retained, as explained above.

This suspended coaxial FET configuration of the invention provides several important advantages. Because the gate metal coaxially covers the entire length of the nanotube, application of a voltage to the gate electrode can precisely tune the electronic carrier density of the full extent of the conducting channel formed by the length of the nanotube. Further, because the gate metal overlaps the source and drain regions and catalyst regions, and is separated from these regions by the gate dielectric, application of a voltage to the gate electrode can precisely tune the Schottky barriers between the nanotube and each of the source and drain regions, by modulating the electrostatic potential of the electrical contact between the nanotube and these regions. This capability is particularly important for the production of nanotube FET circuits, because the contact resistance between a nanotube and source and drain regions can contribute significantly to the total resistance of the circuit.

Finally, the fully self-supported suspension of the nanotube and its gate metal coating over an aperture extending completely through a structure, as shown in FIG. 16, enables a wide range of sensing applications in which the gate voltage can be modulated along the full length of the nanotube and completely around the nanotube circumference in response to ambient conditions.

In accordance with the invention, lift-off and other lithographic techniques can be employed for patterning a gate metal to be formed on a suspended nanotube. For many applications it can be preferred to form the nanotube metal coating by a thermal evaporation process in the manner described above. For example, a 15 nm-thick layer of Cr can first be deposited by the thermal evaporation process described above, followed by a 25 nm-thick layer of gold, also deposited by the thermal evaporation process described above. Because the thermal evaporation results in a blanket coating of the structure, the exposed contact areas of the source and drain electrodes that were exposed by the previous processing step, so as to not be covered by gate dielectric, are preferably protected from the gate metal deposition. But as just described, the gate metal preferably does overlap with a portion of the source and drain electrode regions that are coated with the gate dielectric.

In one example process for carrying out this sequence, prior to metal deposition a layer of photoresist, e.g., Shipley 1818, is spin-coated on the substrate and nanotube, e.g., at a speed of about 3000 rpm. The photoresist is then patterned to expose a region of the dielectric-covered substrate away from the source and drain, to define a gate electrode contact pad, and to expose the nanotube. Once the photoresist is patterned, gate electrode deposition can proceed in the manner described above, resulting in the configuration shown in FIG. 15. As shown here, the gate electrode 72 extends from the coaxially-wrapped suspended nanotube to the edges of the aperture 52, overlapping with the source and drain regions 73 coated with gate dielectric, and extends out to one or more contact regions 72 away from the drain and source electrode regions 56. With this configuration, a gate voltage can be applied to the nanotube in a uniform fashion.

With this deposition, a nanotube-based p-type FET device is complete, and additional processing can be carried out, if desired, e.g. to encapsulate the nanotube-based FET structure. Note in the processes described above that the integrity of the suspended nanotube is not impaired by spin coating or removal of photoresist, or by the etching of materials on a substrate while masked by photoresist. It is therefore contemplated by the invention that a wide range of conventional microfabrication processes can be carried out with the suspended nanotube in place on a substrate in a device configuration.

In conjunction with production of nanotube-based devices, the invention contemplates the use of one or more coating techniques and one or more coating materials for producing a particularly-selected nanotube device configuration. For example, as previously described, a nanotube can be coated with an electrically insulating layer and an overlaying electrically conducting layer to form a FET gate dielectric layer and gate, respectively, on the nanotube, here operating as a FET channel. This FET nanotube channel configuration is particularly well-addressed by the processes of the invention in that the nanotube coating layers can be selected in accordance with the invention to render a semiconducting nanotube p-type semiconducting or n-type semiconducting. This selective coating technique of the invention enables the fabrication of nanotube-based complementary logic devices and circuits, and can be directly adopted for standard microfabrication in mass production of nanotube devices and circuits.

In accordance with the invention, it is understood that as-synthesized, nanotubes may be metallic, i.e., characterized as having no electronic band gap between valence and conduction bands; or may be semiconducting, characterized as having an electronic band gap between valence and conduction bands. It is known that the chirality of a nanotube as-synthesized can render the nanotube semiconducting, based on the correspondence between the band structure of the nanotube and the nanotube diameter.

The electrical conductivity of a synthesized nanotube can be determined by measuring the electrical current through the nanotube as a function of a voltage applied at the ends of the nanotube. The nanotube synthesis process of the invention, described in detail above, well addresses this measurement technique. By synthesizing a nanotube in place with the nanotube ends in electrical contact with electrodes, i.e., contact pads, as in FIG. 13, electrical measurement of a nanotube can be carried out immediately after synthesis without the need for manipulation of the nanotube.

It has been shown that semiconducting nanotubes are in general p-type when exposed to ambient air. It is understood that ambient air species, e.g., oxygen molecules, can be absorbed onto the nanotube surface and through surface interaction alter the nanotube electrical state. Whatever the surface interaction with ambient air species might be, it is found that such interaction tends to render nanotubes p-type. As a result, in general, it is understood that as-grown semiconducting nanotubes are p-type.

The invention addresses this limitation by providing specific nanotube coating processes that enable the reliable and reproducible production of both p-type and n-type semiconducting nanotubes. In accordance with the invention, the coating of a semiconducting nanotube with a layer of a dopant material such as an electrically conducting material, e.g., a metal, is found to render the nanotube n-type. The metal or other dopant material is selected to contribute a sufficient dose of electrons to the nanotube to render the nanotube electrically semiconducting as n-type. Any of the coating processes described above can be employed for applying the desired dopant coating. For example, Cr or Ti can be thermally evaporated for coating a nanotube with a metal layer.

The invention is not limited to a particular dopant material or deposition process for producing an n-type nanotube. All that is required is the coating of a nanotube with a dopant material that provides sufficient electrons to the nanotube for rendering the nanotube n-type semiconducting. Alternative to metals, doped polysilicon or other conducting material, or other suitable material can be employed. Whatever dopant material is selected, it preferably can easily adhere to the nanotube surface with very good surface coverage and uniform coating. For many applications it can be preferred that the selected material be a "good" electrical conductor so that the material can easily contribute a significant dose of electrons to the underlying nanotube.

The dopant coating thickness is preferably that which is sufficient to uniformly coat the nanotube. The dopant layer should not, however, be so thick as to dominate electrical conduction by the nanotube. In other words, the dopant coating must preserve the nanotube as the dominant conduction path between ends of the nanotube. For example, it is found that a thin Cr coating, e.g., of between 1 nm-4 nm in thickness, is sufficient for rendering a nanotube n-type. A significantly thicker metal coating may dominate conduction and render the operation of the coated nanotube as a conductor.

It is found experimentally that once a semiconducting nanotube is coated with a metal layer, the semiconducting nanotube indeed is rendered n-type. However, once the thusly rendered n-type nanotube is exposed to ambient air, the nanotube electrical state can revert to p-type over time. This is understood to be due to the absorption of ambient air species, e.g., oxygen molecules, on the metal surface, and reaction of the absorbed species with the nanotube, through the metal layer, in a manner that compensates for the metal's contribution of electrons.

In accordance with the invention, the n-type semiconducting state of a nanotube coated with an electrically conducting layer can be preserved. This preservation is carried out by a step of coating the metal or other conducting layer with a barrier layer material. The barrier layer protects the conducting layer-coated nanotube from interaction with ambient air species or other environments and thereby enables the nanotube to retain the n-type semiconducting state produced by the conducting coating layer.

In general, suitable barrier layer materials are those that easily adhere to an underlying metal layer and provide a uniform, continuous coating on the nanotube. Additionally, suitable barrier layer materials preferably do not counterdope the nanotube to compensate for its n-type semiconducting state. Rather, if the barrier layer interacts with the nanotube at all, it preferably provides additional electron doping of the nanotube to enhance the n-type semiconducting state of the nanotube. The barrier material thickness is selected based on the quality of the barrier material and can be employed doubly for a specific role in a given application.

An example barrier layer material that is found to maintain the n-type semiconducting state of a nanotube is $Al_2O_3$, which can be deposited by, e.g., ALD techniques like those previously described. The thickness of the $Al_2O_3$ or other barrier layer sufficient to maintain the n-type state of the nanotube is dependent on the quality of the barrier material. For example, a near-perfect, continuous film can operate as a barrier with as little as a few monolayers in thickness. But for lower quality films, a thicker barrier can be required. An $Al_2O_3$ layer thickness of, e.g., about 20 nm is found to be sufficient.

In an example of a process for producing an n-type semiconducting nanotube, a suspended semiconducting nanotube can be provided in the structural configuration of FIGS. 13-14 for conversion to n-type state in situ in a FET structure. First a conducting layer, e.g., a 1 nm-thick layer of Cr, is formed on the nanotube for doping the nanotube n-type. It can be preferred to thermally evaporate the metal from the back side of the structure 58 through the aperture 59. This back-side-directed evaporation results in coating of the nanotube while self-masking the front of the structure, including the source and drain regions 56, from the Cr coating. If such back-side-directed evaporation is not feasible, then a lift-off or other deposition technique can be employed in the conventional manner.

With the metal layer provided coaxially along the entire length of the suspended nanotube, the structure is then positioned in an ALD chamber for deposition of an $Al_2O_3$ barrier layer. Prior to the $Al_2O_3$ deposition, the flow of an inert gas, e.g., nitrogen, is commenced as the ALD chamber temperature is increased to a desired deposition temperature, e.g., about 250° C. The ALD process is then commenced, e.g., employing the ALD recipe described above, to coat the metal layer with the $Al_2O_3$ barrier layer.

Once a barrier material is applied to the metal layer to preserve the n-type semiconducting state of the nanotube, one or more additional materials can be applied over the barrier material as-needed for a given nanotube device application. For example, where the n-type semiconducting nanotube is to be employed as a FET channel, it can be desirable to provide a high quality gate dielectric layer over the barrier material, even where the barrier material itself is a dielectric. In the example of an $Al_2O_3$ barrier material, the barrier layer can itself also be employed as a gate dielectric, or an additional one or more gate dielectric layers can be provided. This enables the selection of any suitable gate dielectric separate from or in cooperation with the barrier layer material.

Summarizing this scenario, in one example process for producing a high-quality n-type nanotube FET device, a nanotube is synthesized in the manner given above, to form a nanotube suspended between source and drain electrodes, as shown in FIGS. 13-14. For many applications, it can be preferred to provide the source and drain electrodes in the manner described above, e.g., electrodes that are several microns in width and that are formed by metal lift off of, e.g., a 50 nm-thick layer of Pt followed by a 50 nm-thick layer of Cr. Also, for many applications it can be preferred to provide nanotube catalyst regions on top of the metal electrodes so that the nanotube is synthesized in place spanning the extent of an aperture between the electrodes. As described above, the nanotube catalyst regions can be formed by, e.g., thermal evaporation of a catalyst material, e.g., an Fe layer of between about 8-16 angstroms in thickness.

Synthesis of a suspended nanotube across an aperture can then be carried out as described above, e.g., over an aperture in a self-supporting membrane. Nanotube synthesis is preferably carried out as described above, by a methane gas flow of, e.g., about 200 sccm, at a temperature of about 900° C., for 5 minutes or less.

Given a semiconducting nanotube, the nanotube is then coated with a conducting material, e.g., a 1 nm-thick layer of Cr, e.g., by the thermal evaporation process described above, to render the nanotube n-type semiconducting. The metal-coated nanotube is then subjected to an ALD sequence in which the nanotube is first exposed to a flow of nitrogen or other inert gas as the temperature is ramped from ambient, or other starting temperature, in an ALD chamber, to about 250° C., or other selected deposition temperature. At the completion of the temperature ramping, a 20 nm-thick layer of $Al_2O_3$ is then deposited on the metal-coated nanotube, e.g., following the deposition parameters given above.

In a next process step, a gate dielectric layer, e.g., a layer of $Si_3N_4$ having a thickness of, e.g., about 70 nm, is deposited coaxially along the entire length of the suspended nanotube, on the $Al_2O_3$ layer, e.g., using the LPCVD process parameters given above, to supply a high-quality gate dielectric on the nanotube and on the source and drain regions. Once the nitride, or other selected gate dielectric, is deposited, the nitride and the underlying aluminum oxide or other barrier material, is etched from the electrode regions, in the manner described above with reference to FIG. 15, by lithographic patterning of a photoresist layer and a selected RIE process like that given above, such that a portion of the source and drain regions are exposed for making electrical contact.

With the dielectric and barrier layers patterned, one or more layers of gate metal can then be deposited coaxially along the entire length of the suspended nanotube and on at least a portion of the source and drain regions. For example, a 15 nm-thick layer of Cr can first be deposited by the thermal evaporation process described above, followed by a 25 nm-thick layer of gold, also deposited by the thermal evaporation process described above. A patterned lift-off process is here preferably employed, as described above, to remove the metal layer from the substrate and from portions of the source and drain regions other than the gate electrode region. With this last step, an n-type nanotube FET with gate dielectric and gate metal in place coaxially along the entire length of the suspended nanotube and overlapping the source and drain regions is produced as shown in FIG. 16.

With this process for producing n-type nanotube-based FET devices, the invention enables nanotube-based complementary logic devices and circuits. A p-type nanotube FET can be produced by coating a semiconducting nanotube with a selected gate dielectric layer and a selected gate material layer in the manner described previously. It is found that silicon nitride and silicon dioxide operate as high quality gate dielectric materials and preserve the p-type semiconducting state of a semiconducting nanotube; they do not operate as barrier materials. A semiconducting nanotube that has been coated with a metal layer, e.g., a layer of Cr, and then coated with a layer of silicon nitride after an initial annealing step, is found to revert to a p-type semiconducting state even though the metal layer has been applied, unless the Cr layer is at least about 4 nm thick. But such a thick Cr layer can contribute the electrical conduction of a nanotube. It is therefore understood that silicon nitride is not an optimal barrier material for preserving the n-type semiconducting state of a metal-coated semiconducting nanotube.

Figure 17:
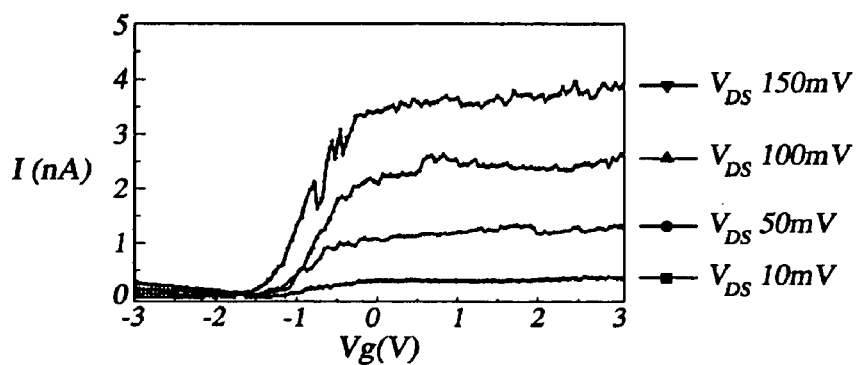
FIG. 17 is a plot of experimentally measured operational characteristics for an n-type nanotube FET fabricated in accordance with the invention.

FIG. 17 is a plot of the experimentally measured gate transfer characteristic of an n-type nanotube-based FET produced in accordance with the steps just described. The nanotube is here suspended across an aperture in the manner shown in FIGS. 13-16. In this experimental example, the nanotube was synthesized in the manner given above as a SWNT. The n-type semiconducting condition of the SWNT was produced by depositing a 1.2 nm-thick layer of Cr on the nanotube by thermal evaporation as-described above. A barrier layer of a 20 nm-thick $Al_2O_3$ coating was deposited by ALD as-described above on the Cr layer. The $Al_2O_3$ layer was employed as a gate dielectric. A gate layer was produced as 25 nm-thick Cr thermally evaporated coating followed by a 35 nm-thick thermally evaporated Ag coating. Ag/Cr electrodes provided on a substrate in the manner of FIG. 15 were employed as the drain and source of the FET.

Figure 18:
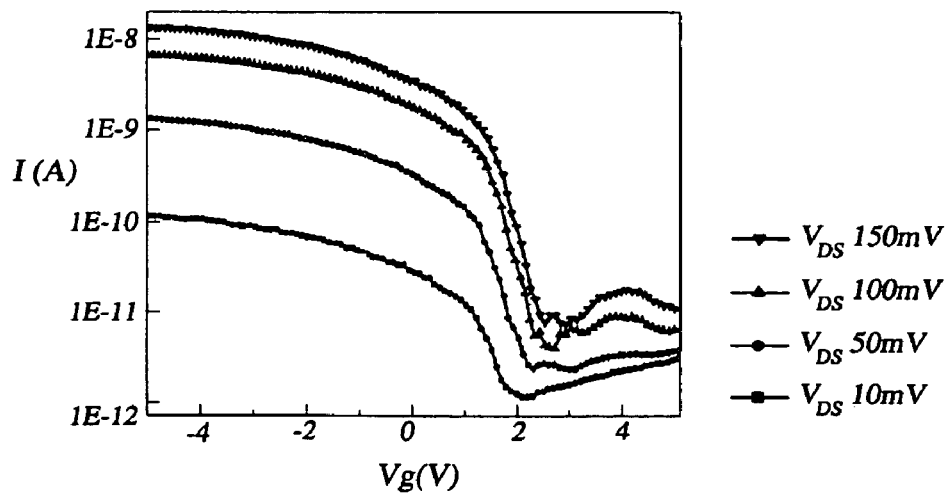
FIG. 18 is a plot of experimentally measured operational characteristics for a p-type nanotube FET fabricated in accordance with the invention.

FIG. 18 is a similar plot of the experimentally measured gate transfer characteristic of a p-type nanotube-based FET produced in accordance with the invention. An array of p-type nanotubes were synthesized suspended as in the manner of FIGS. 13-16. For this experimental example, the nanotubes were synthesized as-described above as SWNTs. A 100 nm-thick layer of $Si_3N_4$ was deposited by the LPCVD technique described above, coaxially covering the entire length of each of the nanotubes. The $Si_3N_4$ layer operated as a gate dielectric layer. A gate metal layer was provided on each nanotube following the procedure given above for the n-type FET.

These experimental results confirm that the processes of the invention enable the production of nanotube-based FET complementary logic devices. The p-type nanotube FET is shown to exhibit an on-off ratio of about 2000 and a subthreshold swing of about 500 mV/decade. The invention thus enables production of n-type and p-type nanotube-based FETs connected between electrical contact pads in the formation of nano-scale sensors, circuits, and systems.

In the production of such sensors, circuits, and systems, it is found that the growth of SWNTs across apertures typically produces an array of several suspended nanotubes, e.g., together bridging source and drain electrodes of an FET structure. As explained above, it is not at this time possible to preferentially synthesize semiconducting nanotubes over metallic nanotubes; both semiconducting and metallic nanotubes can simultaneously be produced in an array of nanotubes resulting from a single synthesis process.

The invention provides techniques for eliminating unwanted nanotubes, e.g., metallic nanotubes, from an array of nanotubes, in situ after formation of FET structures. Such metallic nanotube removal provides the ability to controllably produce p-type and n-type nanotube FET structures in a selected configuration. In general, prior to the nanotube removal method of the invention, an array of nanotubes is synthesized across an aperture in the manner described above, resulting in the structure of FIG. 13, showing just one of the nanotubes in the array. FET devices are then fabricated in the manner given above, with a gate dielectric such as a silicon nitride layer employed for production of p-type FET devices under a gate metal. If n-type nanotube FET devices are desired, the nanotubes are first coaxially coated with a metal layer and a barrier layer and then an additional dielectric layer if desired, in the manner given above, prior to gate metallization.

In accordance with the invention, once the FET devices are formed with a nanotube array, controlled electrical breakdown is employed to eliminate the metallic SWNTs in the array. This is accomplished by protecting the semiconducting SWNTs from discharge damage by gating to avoid large current flows through the semiconducting nanotubes. Depleting the desired semiconducting SWNTs by a suitable gate voltage results in large destructive current flow mainly through the metallic or most highly-conducting SWNTs under high source-drain bias voltage. This destructive current flow effectively breaks the unwanted metallic nanotubes, with the semiconducting nanotubes preserved. Given this metallic nanotube removal technique, it is preferred that the gate dielectric material on the nanotubes be sufficiently robust to fully separate a nanotube from the gate metal layer. Any leakage current between a nanotube and the gate metal could result in unintended nanotube damage.

Figure 19A:
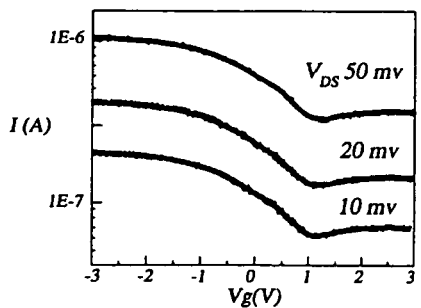
FIGS. 19A-F are plots of experimentally measured characteristics relating to breakdown of metallic nanotubes in an array of nanotubes provided in a FET configuration in accordance with the invention.
Figure 19B:
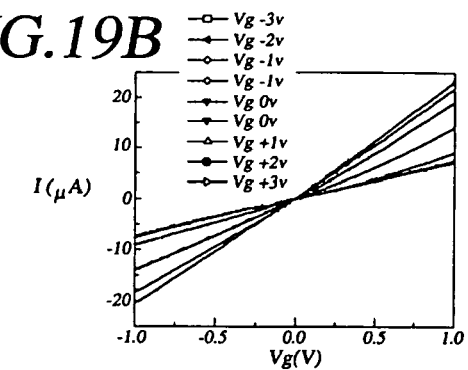

FIGS. 19A-19B are experimentally measured plots of the characteristics of an FET structure experimentally fabricated in the configuration of FIG. 16 and including multiple SWNTs all of about 1 μm in length and all including a coaxial silicon nitride gate dielectric layer of 100 nm in thickness underlying a coaxial gate metal layer; with this configuration the semiconducting nanotubes were p-type. The plots of FIGS. 19A-19B indicate that the metallic SWNTs in the array of nanotubes dominate the electronic transport and result in a very low ON-OFF ratio of only ~3. Depletion of hole carriers occurs at positive gate voltage and inversion to n-type occurs at gate voltages, $V_g$, greater than +1 V.

Figure 19C:
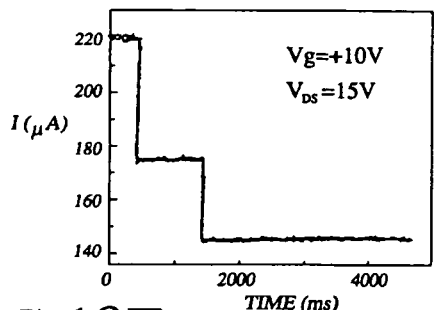
Figure 19D:
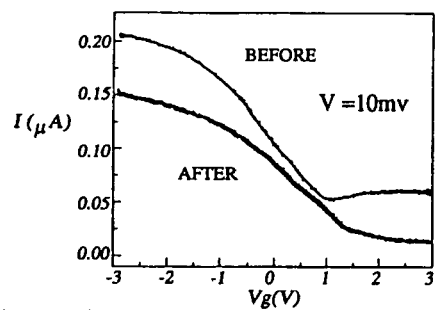

An electrical breakdown process was carried out on the array of nanotubes just described to remove metallic nanotubes from the FET structure. In this process, the gate voltage to be applied during breakdown is preferably that which biases the FET in charge depletion for the given nanotube characteristics. The source-to-drain voltage is then set at a value that will cause breakdown of metallic nanotubes. FIG. 19C is a plot of the experimentally measured time evolution of the breakdown process, employing an example gate voltage, $V_g$, of 10 V and a source-drain bias voltage, $V_{DS}$, of 15 V. After the breakdown process, the OFF state current of the device was reduced, as shown in FIG. 19D, and no inversion occurred at $V_g$=+3V, indicating the breakdown of some large diameter semiconducting SWNTs, as well as metallic SWNTs.

Figure 19E:
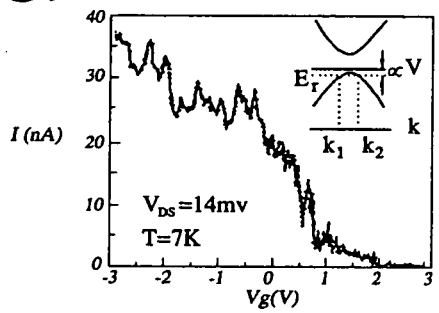
Figure 19F:
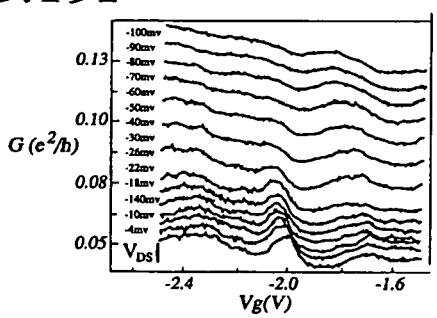

When the temperature of the structure was lowered to 7 K, pronounced oscillations of source-drain current appear in the FET transfer characteristic, as shown in FIG. 19E. These can be explained as electron Fabry-Perot interferences inside the semiconducting SWNTs in the FET ON state. The inset of FIG. 19E diagrammatically illustrates how such an interference effect comes about for semiconducting nanotubes. The oscillations are very significant in the ON state at negative gate voltage. They essentially disappear in the OFF state at positive gate voltage. FIG. 19F shows the linear conductance versus gate voltage near a gate voltage of about 2V for different source-drain bias voltages. The interference patterns are well reproducible while scanning the gate voltage. As seen clearly, the conductance peaks shift to more negative gate voltages as the source-drain bias voltage is increased negatively. A possible explanation is that as the source-drain bias voltage is increased, there are more and more states with different wave vectors, k contributing to the interference. Consequently, the peak position shifts in concert with the shift of the average contribution of all these states. Also, the conductance oscillations smear out as the source-drain voltage increases. This observation of Fabry-Perot type interference in the passivated SWNTs suggests that suspended SWNTs produced in accordance with the invention are high quality with few intrinsic defects.

It is noted that the electrical breakdown of SWNTs can complete quite rapidly after application of a high source-drain voltage, and therefore damage to all SWNTs, including desired semiconducting nanotubes, can occur. It is therefore preferred in accordance with the invention that the breakdown process be carried out with a feedback loop configured to monitor the source-drain current during the "burning" process and correspondingly control the process. In one example of such a feedback control, the source-drain current is monitored as the breakdown process proceeds. If the source-drain current is found to drop below a certain threshold value, indicating breakdown, then the source-drain bias voltage of the FET structure is reset to zero so that the remaining SWNTs are protected.

This feedback control of the breakdown process is particularly valuable for reliably producing FET devices from as-grown SWNT arrays. It is understood that at high source-drain bias voltages, optical phonon scattering can play an important role in the electron transport of both m-SWNTs and s-SWNTs. Typically, the current-carrying capability of a single SWNT is tens of μA. Therefore, to obtain at least one SWNT protected for a FET device, it is preferred in accordance with the invention to employ a source-drain threshold current of about 10 μA for triggering reset of the source-drain bias voltage.

With this breakdown technique, control of gate voltage biasing can be employed to select s-SWNTs with desired band gaps for optimizing FET performance, since as-grown SWNTs often have a distribution of diameters, d, and thus a distribution of band-gaps $E_g \propto 1/d$. In this selection technique, an initial electrical breakdown is carried out by biasing the FET with a relatively high positive gate voltage to destroy the large-diameter, small band gap, s-SWNTs showing inversion and to destroy the metallic SWNTs. This initial breakdown is followed by a second electrical breakdown biased at selected lower gate voltages which maintains the desired nanotubes in the OFF state. The second breakdown process eliminates small-diameter s-SWNTs which still have some conduction at the desired OFF-state gate voltage. With this two step breakdown process, the ON-OFF ratio of the FET device can be controllably improved.

Figure 20:
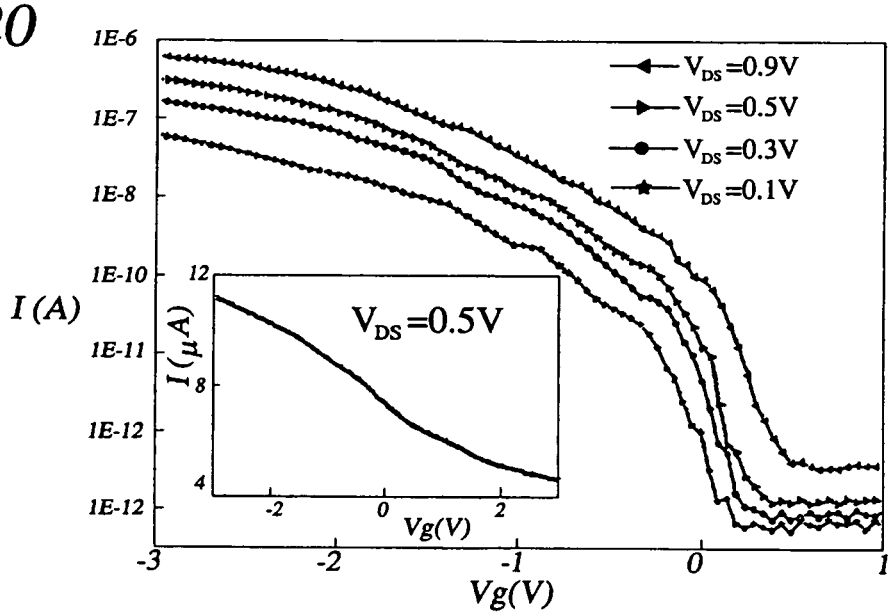
FIG. 20 is a plot of experimentally measured characteristics relating to a two-step breakdown of metallic nanotubes in an array of nanotubes provided in a FET configuration in accordance with the invention.

FIG. 20 is an experimentally measured plot of the FET transfer characteristic produced for this two-step breakdown process. In the first step, the FET gate was biased at +10 V to carry out an initial electrical breakdown process, followed by a final breakdown process with a gate bias of +3V and a source-drain bias voltage of −30V. A threshold current of 20 µA was set for automatic feedback control to reset the drain-source bias for protecting desired nanotubes. As seen in the plot, the ON-OFF ratio is greatly improved by the two-step process, from only ~3 for the initial FET to more than $10^5$, and the subthreshold swing is S~150 mV per decade for the final device.

Thus, it is found in accordance with the invention that CVD growth of SWNT arrays via solid Fe catalyst, formation of FET structures with those arrays, and feedback-controlled electrical breakdown of unwanted nanotubes in the arrays provide the ability to produce high-performance suspended nanotube FETs. It is here noted that the growth yield for suspended SWNTs crossing apertures in the manner described above is very high. For example, given an aperture of <3 µm in width, there can be expected nearly 100% yield of SWNT devices with SWNT arrays bridging the electrodes. Therefore, by combining the post-growth electrical breakdown method of the invention, large-scale production of SWNT FETs is achievable, without addressing the difficult problem of selectively growing only semiconducting SWNTs.

For many applications, the process of the invention for producing n-type nanotube devices can be employed where a nanotube or nanotubes are fully supported on a substrate rather than being suspended across an aperture or trench. The invention does not require that the nanotube be suspended in the production of a n-type nanotube.

In an example of a process for producing an n-type nanotube that is fully supported on a substrate, the nanotube-electrode configuration of FIGS. 14-15 can be employed on a continuous substrate, i.e., without the inclusion of an aperture 59 in a support structure between the source and drain electrodes. In a first step, the electrodes can be formed and a nanotube catalyst region provided on each electrode. Then selected layers are formed on the substrate for coating the underlying surface of the nanotube after synthesis of the nanotube in place on the substrate. For example, where it is desired to provide a gate metal layer on both the lower and upper surfaces of a nanotube, a stripe of gate metal is provided between the electrodes, followed by deposition of a gate dielectric and a barrier material. A stripe of dopant material for rendering the nanotube n-type is then deposited on the substrate between the electrodes along a path to be followed by the nanotube, and preferably not touching the electrodes. The dopant material is deposited over the gate dielectric and a barrier material layers. A nanotube is then synthesized between the two electrodes in the manner given above, along the path of the dopant material stripe.

With the synthesized nanotube in place, an upper dopant layer is deposited on the nanotube to fully render the nanotube n-type. This deposition process, e.g., employing a metal layer, is preferably carried out by, e.g., a lift-off process such that the conducting layer covers the nanotube only and does not touch the electrodes, so as to not produce a short circuit between the electrodes. Then barrier and insulating layers are deposited on the nanotube in a similar fashion. Finally, a gate electrode layer can be deposited on the nanotube. If it is preferred to employ only a lower gate under the nanotube then this upper gate electrode layer deposition can be omitted. Similarly, if only an upper gate electrode is desired, then the previous lower gate electrode layer deposition can be omitted.

For many applications, coaxial coating of the full circumference of a nanotube along its entire length is elegantly straightforward if the nanotube is suspended over a trench, aperture, or other gap between electrodes. Deposition of materials on a nanotube that is disposed flat on a substrate can in general require twice as many steps. But it is recognized in accordance with the invention that not all applications may be well-addressed by a suspended nanotube configuration, and therefore the invention contemplates configurations in which a nanotube is disposed flat on an underlying support substrate.

Coating of as-grown carbon nanotubes with high-quality materials can be carried out by the processes of the invention to produce metallic and both n-type and p-type semiconducting nanotube-based devices. This approach, which is highly compatible with standard silicon device microfabrication processes, is particularly well suited to applications for electronic and electromechanical devices, chemical sensors, and other devices that are fabricated to incorporate carbon nanotubes. Nanotube field effect transistors in the configuration provided by the invention, with semiconducting nanotubes incorporating selected dielectrics and conducting coatings, enable stable device operation in a variety of environments and with high transconductance. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A carbon nanotube field effect transistor comprising:
   a carbon nanotube having a length suspended between a source electrode and a drain electrode that are together disposed on a common surface of a support structure;
   a gate dielectric material coaxially coating the suspended nanotube length and coating at least a portion of the source and drain electrodes; and
   a gate metal layer coaxially coating the gate dielectric material along the suspended nanotube length and overlapping a portion of the source and drain electrodes, separated from the electrodes by the gate dielectric material.

2. The carbon nanotube field effect transistor of claim 1 wherein the carbon nanotube comprises a single-walled carbon nanotube.

3. The carbon nanotube field effect transistor of claim 1 wherein the carbon nanotube comprises a p-type semiconducting carbon nanotube.

4. The carbon nanotube field effect transistor of claim 1 wherein the carbon nanotube comprises an n-type semiconducting carbon nanotube.

5. The carbon nanotube field effect transistor of claim 4 further comprising an electrically conducting dopant material coaxially coating the length of the suspended nanotube under the gate dielectric material and rendering the nanotube n-type semiconducting.

6. The carbon nanotube field effect transistor of claim 5 further comprising a barrier layer coaxially coating the length of the suspended nanotube over the dopant material and preserving the n-type semiconducting state of the nanotube.

7. The carbon nanotube field effect transistor of claim 6 wherein the barrier layer is the gate dielectric material.

8. The carbon nanotube field effect transistor of claim 6 wherein the barrier layer is provided under the gate dielectric material.

9. The device of claim 1 wherein the source and drain electrodes are provided on a support structure having an aperture across which the carbon nanotube length is suspended.

10. The device of claim 9 wherein the support structure comprises a membrane.

11. The carbon nanotube field effect transistor of claim 1 wherein the nanotube is a self-supported bridge between the source electrode and the drain electrode.

12. The carbon nanotube field effect transistor of claim 9 wherein the nanotube is a self-supported bridge across the aperture between the source electrode and the drain electrode.

13. The carbon nanotube field effect transistor of claim 1 wherein the source electrode and the drain electrode each include at least one material selected from the group consisting of Pt, Ag, and Cr.

14. The carbon nanotube field effect transistor of claim 1 wherein the gate dielectric material is selected from the group consisting of $Si_3N_4$, $Al_2O_3$, and $SiO_2$.

15. The carbon nanotube field effect transistor of claim 1 wherein the gate metal layer comprises Cr.

16. The carbon nanotube field effect transistor of claim 5 wherein the dopant material is selected from the group consisting of Cr and Ti.

17. The carbon nanotube field effect transistor of claim 5 wherein the dopant material coating is sufficiently thin to preserve the nanotube as a dominant electrical conduction path between the source and drain electrodes.

18. The carbon nanotube field effect transistor of claim 6 wherein the barrier layer comprises $Al_2O_3$.

19. The carbon nanotube field effect transistor of claim 10 wherein the membrane comprises a $Si_3N_4$ membrane.

20. The carbon nanotube field effect transistor of claim 1 further comprising a first nanotube catalyst region disposed on top of the source electrode and a second catalyst region disposed on top of the drain electrode, the nanotube length being suspended between the catalyst regions.

21. The carbon nanotube field effect transistor of claim 20 wherein the catalyst regions are formed of a material selected from the group consisting of Fe, Co, and Ni.

22. The carbon nanotube field effect transistor of claim 20 wherein each catalyst region is disposed at an edge of an aperture, provided in the support structure, across which the carbon nanotube is suspended between the source electrode and the drain electrode.

23. The carbon nanotube field effect transistor of claim 1 wherein the source electrode and the drain electrode are each disposed at an edge of an aperture, provided in the support structure, across which the carbon nanotube is suspended between the source electrode and the drain electrode.

24. The carbon nanotube field effect transistor of claim 1 further comprising a metal buffer layer coaxially coating the length of the suspended nanotube under the gate dielectric material to enable deposition of the gate material on the nanotube.

25. The carbon nanotube field effect transistor of claim 24 wherein metal buffer layer is selected from the group consisting of Cr and Ti.

26. The carbon nanotube field effect transistor of claim 24 wherein the metal buffer layer is sufficiently thin to not contribute to electrical conduction of the nanotube.

27. The carbon nanotube field effect transistor of claim 23 wherein the metal buffer layer is of a thickness between about 0.5 Å and about 10 nm.

28. The carbon nanotube field effect transistor of claim 1 wherein the gate metal layer forms a gate electrode on the common surface with the source electrode and the drain electrode.

29. The carbon nanotube field effect transistor of claim 28 further comprising connections to the source electrode, the drain electrode, and the gate electrode for biasing the transistor.

30. An n-type carbon nanotube field effect transistor comprising:
    a carbon nanotube having a length suspended between a source electrode and a drain electrode;
    an electrically conducting dopant material coaxially coating the length of the suspended nanotube and rendering the nanotube n-type semiconducting;
    a barrier layer coaxially coating the length of the suspended nanotube over the dopant material to preserve the n-type semiconducting state of the nanotube;
    a gate dielectric material coaxially coating the length of the suspended nanotube over the barrier layer; and
    a gate metal layer coaxially coating the gate dielectric material along the suspended nanotube length.

31. The carbon nanotube field effect transistor of claim 30 wherein the dopant material is selected from the group consisting of Cr and Ti.

32. The carbon nanotube field effect transistor of claim 30 wherein the barrier layer comprises $Al_2O_3$.

33. The carbon nanotube field effect transistor of claim 30 wherein the gate dielectric material comprises $Al_2O_3$.

34. The carbon nanotube field effect transistor of claim 30 wherein the source electrode and the drain electrode are each disposed at an edge of an aperture, provided in a support structure, across which the carbon nanotube is suspended between the source electrode and the drain electrode.

* * * * *